US010522616B2

United States Patent
Cho et al.

(10) Patent No.: US 10,522,616 B2
(45) Date of Patent: Dec. 31, 2019

(54) SEMICONDUCTOR DEVICE

(71) Applicant: Samsung Electronics Co., Ltd., Suwon-si (KR)

(72) Inventors: Edward Nam-kyu Cho, Seongnam-si (KR); Tae-soon Kwon, Suwon-si (KR); Bo-ra Lim, Seoul (KR); Jeong-yun Lee, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 164 days.

(21) Appl. No.: 15/823,961

(22) Filed: Nov. 28, 2017

(65) Prior Publication Data
US 2018/0294331 A1  Oct. 11, 2018

(30) Foreign Application Priority Data
Apr. 5, 2017  (KR) .................. 10-2017-0044400

(51) Int. Cl.
*H01L 29/06* (2006.01)
*H01L 29/78* (2006.01)
*H01L 29/66* (2006.01)

(52) U.S. Cl.
CPC ...... *H01L 29/0607* (2013.01); *H01L 29/0669* (2013.01); *H01L 29/66795* (2013.01); *H01L 29/785* (2013.01); *H01L 29/7831* (2013.01); *H01L 2029/7858* (2013.01)

(58) Field of Classification Search
None
See application file for complete search history.

(56) References Cited

U.S. PATENT DOCUMENTS

| | | | |
|---|---|---|---|
| 6,642,115 B1 | 11/2003 | Cohen et al. | |
| 7,381,601 B2 | 6/2008 | Kim et al. | |
| 8,674,342 B2 | 3/2014 | Sleight et al. | |
| 9,064,944 B2 | 6/2015 | Kim et al. | |
| 2014/0001441 A1* | 1/2014 | Kim | H01L 29/0673 257/29 |
| 2014/0151639 A1* | 6/2014 | Chang | H01L 29/42392 257/27 |
| 2016/0020305 A1 | 1/2016 | Obradovic et al. | |
| 2016/0104765 A1 | 4/2016 | Ching et al. | |
| 2016/0172358 A1 | 6/2016 | Hatcher et al. | |
| 2017/0110554 A1 | 4/2017 | Tak et al. | |

* cited by examiner

*Primary Examiner* — Telly D Green
(74) *Attorney, Agent, or Firm* — Muir Patent Law, PLLC

(57) ABSTRACT

A semiconductor device includes: a fin-type active region protruding from a substrate and extending in a first direction; at least one nano-sheet spaced apart from an upper surface of the fin-type active region and facing the upper surface of the fin-type active region, the at least one nano-sheet having a channel region; a gate extending on the fin-type active region in a second direction crossing the first direction and surrounding at least a portion of the at least one nano-sheet; a source/drain region on the fin-type active region on both sides of the at least one nano-sheet; and a source/drain protection layer on a sidewall of the at least one nano-sheet and between the source/drain region and the at least one nano-sheet.

20 Claims, 24 Drawing Sheets

SEMICONDUCTOR DEVICE

CROSS-REFERENCE TO RELATED APPLICATION

This application claims the benefit of priority under 35 U.S.C. 119 to Korean Patent Application No. 10-2017-0044400, filed on Apr. 5, 2017, in the Korean Intellectual Property Office, the disclosure of which is incorporated herein in its entirety by reference.

BACKGROUND

The present disclosure relates to a semiconductor device, and more particularly, to a semiconductor device including a metal-oxide-semiconductor field-effect transistor (MOSFET).

Due to the development of electronics technology, reduction in the size of a semiconductor device, for example, down-scaling of the semiconductor device, is rapidly underway. In order to enhance the performance of down-scaled semiconductor devices, parasitic capacitance can be reduced. Accordingly, down-scaled semiconductor devices benefit from having an optimized device structure or an optimized device manufacturing method that may be optimized for reducing parasitic capacitance.

SUMMARY

The present disclosure provides a semiconductor device having an optimized structure for reducing parasitic capacitance.

According to an aspect of the present disclosure, there is provided a semiconductor device including: a fin-type active region protruding from a substrate and extending in a first direction; at least one nano-sheet spaced apart from an upper surface of the fin-type active region and facing the upper surface of the fin-type active region, the at least one nano-sheet having a channel region; a gate extending on the fin-type active region in a second direction crossing the first direction and surrounding at least a portion of the at least one nano-sheet; a source/drain region on the fin-type active region on both sides of the at least one nano-sheet; and a source/drain protection layer on a sidewall of the at least one nano-sheet and between the source/drain region and the at least one nano-sheet.

According to another aspect of the present disclosure, there is provided a semiconductor device including: a substrate having an active region; at least one nano-sheet stack structure spaced apart from an upper surface of the active region and facing the upper surface of the active region, the at least one nano-sheet stack structure including a plurality of nano-sheets each having a channel region; a gate extending on the active region to cross the active region and covering the at least one nano-sheet stack structure, wherein the gate includes a main gate portion on the at least one nano-sheet stack structure and a sub-gate portion disposed below each of the plurality of nano-sheets; a gate insulating layer between the at least one nano-sheet stack structure and the gate; a source/drain region on the active region on both sides of the at least one nano-sheet stack structure; an outer spacer on the plurality of nano-sheets and covering a sidewall of the main gate portion; inner spacers between the source/drain region and the gate, and between the plurality of nano-sheets; and a source/drain protection layer on a sidewall of the at least one nano-sheet stack structure and between the source/drain region and the at least one nano-sheet stack structure.

According to another aspect of the present disclosure, there is provided a semiconductor device including: a fin-type active region protruding from a substrate and extending in a first direction; a plurality of nano-sheets that are spaced apart from an upper surface of the fin-type active region and spaced apart from one another in parallel to the upper surface of the fin-type active region, each of the plurality of nano-sheets having a channel region; a gate extending on the fin-type active region in a second direction crossing the first direction and surrounding at least a portion of each of the plurality of nano-sheets, wherein the gate includes a main gate portion on at least one nano-sheet and a plurality of sub-gate portions disposed between the nano-sheets and the fin-type active region; a gate insulating layer between the nano-sheets and the gate; a source/drain region on the fin-type active region on opposite sides of the at least one nano-sheet; inner spacers between the source/drain region and the sub-gate portion and between the nano-sheets; and a source/drain protection layer on a sidewall of the at least one nano-sheet, and between the source/drain region and the at least one nano-sheet.

According to the semiconductor device of the present disclosure, an inner spacer that contacts a source/drain region is included in each space between a plurality of nano-sheets, thereby reducing parasitic capacitance between a gate and the source/drain region.

In the semiconductor device of the present disclosure, a source/drain protection layer is formed on a sidewall of the plurality of nano-sheets, between a source/drain region and the plurality of nano-sheets. The source/drain protection layer may prevent damage to the source/drain region during the manufacture of the semiconductor device.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

The present disclosure will now be described more fully with reference to the accompanying drawings, in which exemplary embodiments of the present disclosure are shown. Embodiments of the present disclosure described below may be implemented as one of them, and also, the embodiments described below may be implemented by combining at least two of the embodiments. Therefore, the scope of the present disclosure should not be construed as being limited to any one embodiment.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

Figure 1:
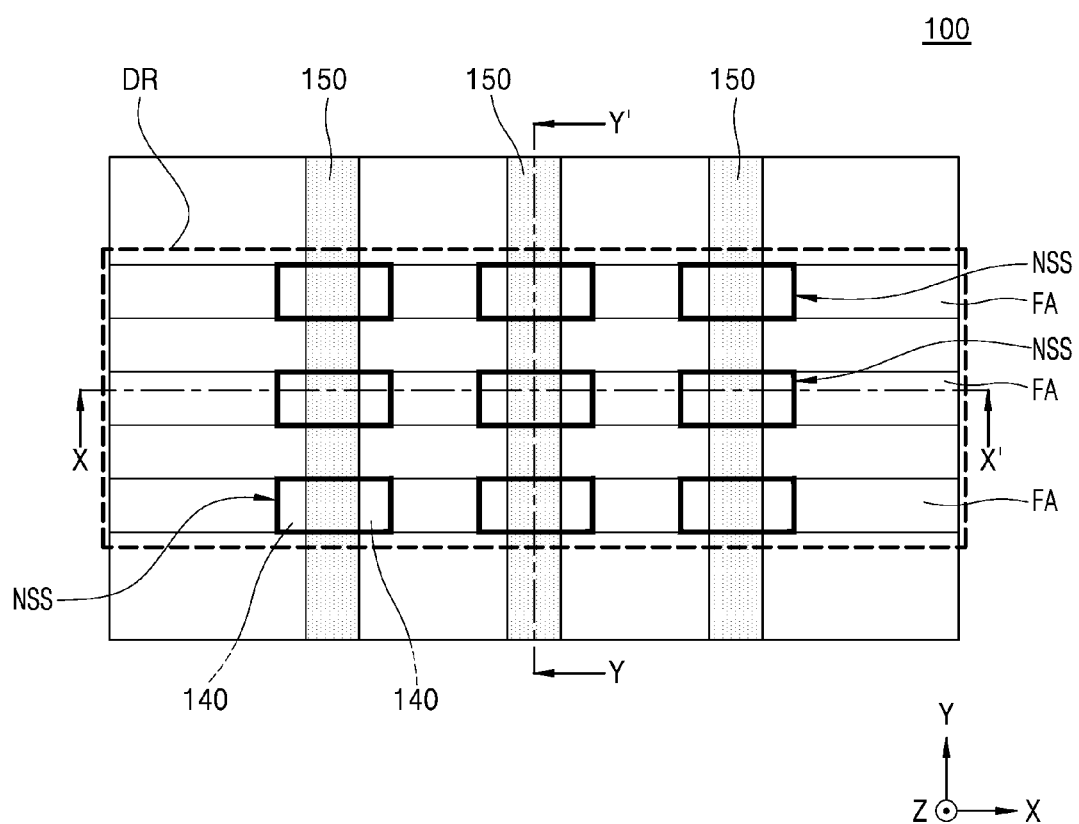
FIG. 1 is a planar layout diagram of a semiconductor device according to an exemplary embodiment of the present disclosure.
Figure 2:
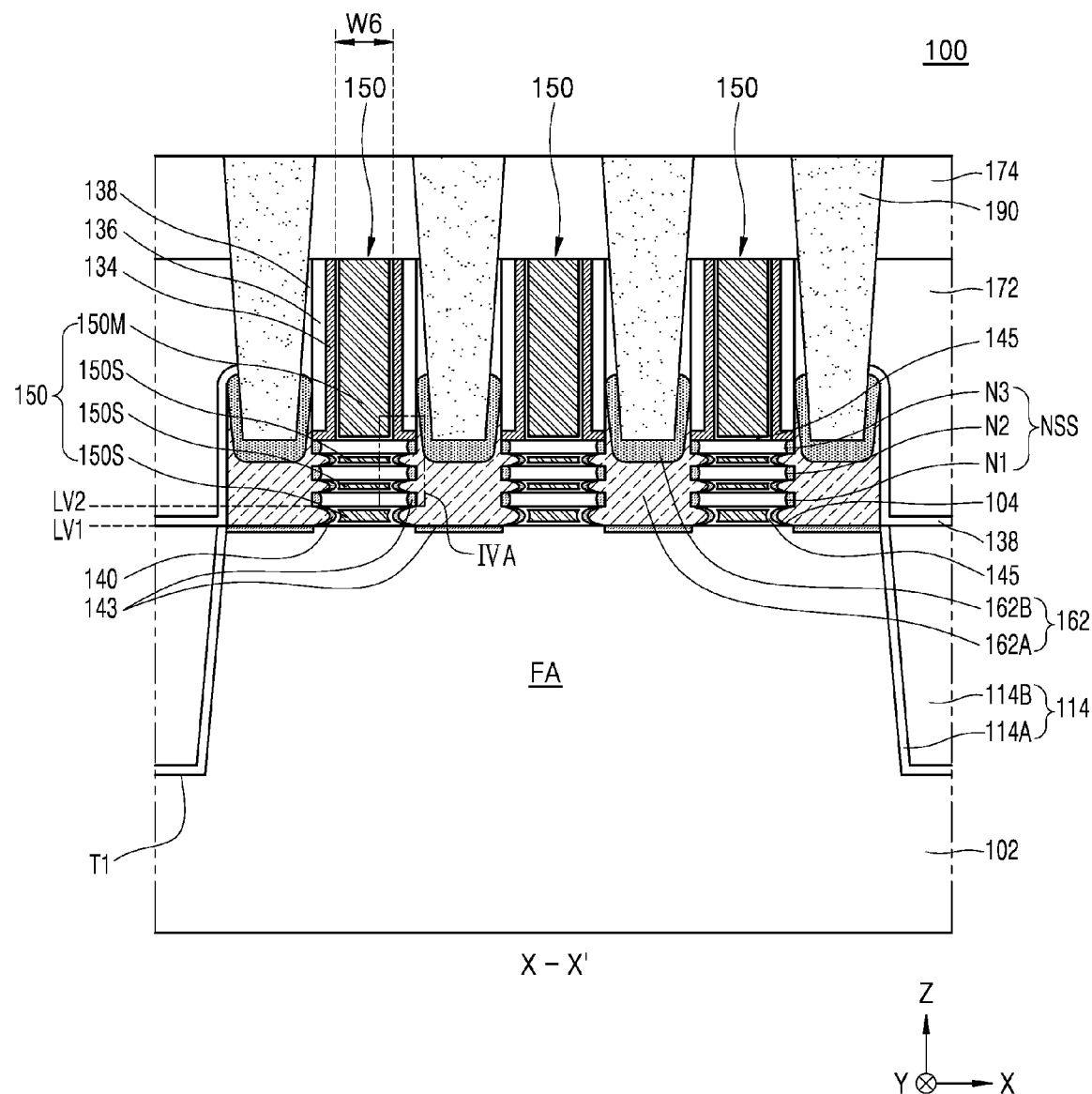
FIG. 2 is a cross-sectional view of the semiconductor device of FIG. 1 taken along a line X-X'.
Figure 3:
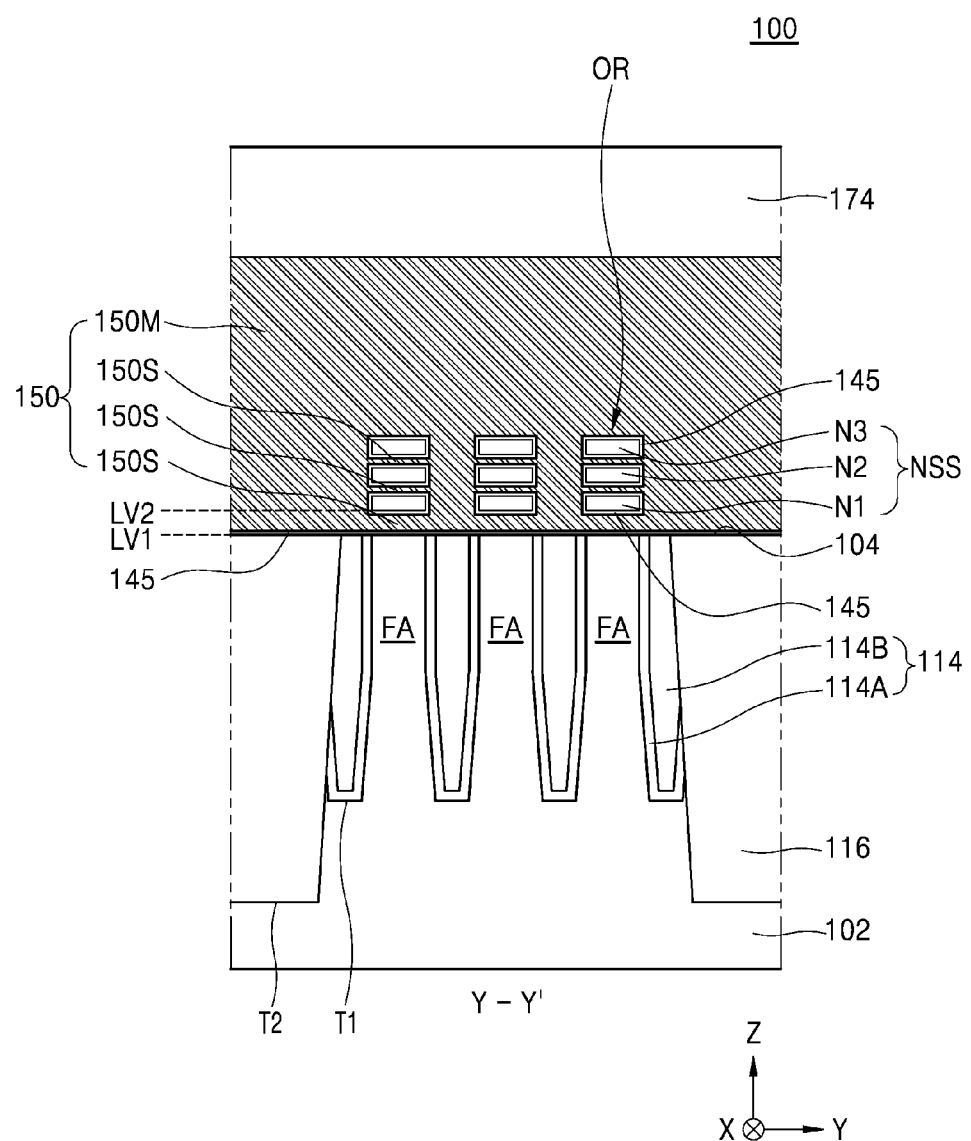
FIG. 3 is a cross-sectional view of the semiconductor device of FIG. 1 taken along a line Y-Y'.

FIG. 1 is a planar layout diagram of a semiconductor device 100 according to an exemplary embodiment of the present disclosure. FIG. 2 is a cross-sectional view of the semiconductor device 100 of FIG. 1 taken along a line X-X'. FIG. 3 is a cross-sectional view of the semiconductor device 100 of FIG. 1 taken along a line Y-Y'.

In detail, the semiconductor device 100 according to the present disclosure may be an integrated circuit semiconductor device. The semiconductor device according to the present disclosure may include a multi-bridge channel field effect transistor (FET). The semiconductor device 100 includes a plurality of fin-type active regions FA that protrude from a substrate 102, extend in a first direction (X direction; e.g., a first direction parallel to an upper surface of the substrate 102), and are spaced apart from one another in a second direction (Y direction; e.g., a second direction parallel to the upper surface of the substrate 102), and a plurality of nano-sheet stack structures NSS that are spaced apart from and face an upper surface 104 of the fin-type active regions FA. The nano-sheet stack structures NSS are spaced apart from one another in the first direction (X direction) and the second direction (Y direction). The fin-type active regions FA may include a first conductivity-type impurity, e.g., a P-type impurity in one embodiment or a second conductivity-type impurity, e.g., an N-type impurity in another embodiment. As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

A first trench T1 defining the fin-type active regions FA and a second trench T2 defining a device region DR may be formed in the substrate 102. The second trench T2 may be deeper in a direction toward a bottom surface of the substrate 102 than the first trench T1. A lower sidewall of the fin-type active regions FA may be covered by a shallow trench isolation (STI) layer 114 filling the first trench T1. The STI layer 114 may include an insulating material, such as a silicon oxide film, a silicon nitride film, a silicon oxynitride film, or a combination thereof.

The STI layer 114 may include a trench insulating liner 114A that conformally covers an inner wall of the first trench T1 and a gap fill insulating layer 114B on the trench insulation liner 114A and filling the first trench T1. The second trench T2 may be filled with an isolation layer 116. A level of the upper surface 104 of the fin-type active region FA, a level of an upper surface of the STI layer 114, and a level of an upper surface of the device isolation layer 116 may be substantially the same.

According to an embodiment, the isolation layer 116 that fills the second trench T2 may be an oxide layer, a nitride layer or a combination thereof. According to an embodiment, the isolation layer 116 and the gap fill insulating layer 114B may be formed of the same material.

A plurality of gates 150 that extend in the second direction (Y direction) crossing the first direction (X direction) and are spaced apart from one another in the first direction are formed on the plurality of fin-type active regions FA. The gates 150 may have a gate length equal to a width W6 of a gate structure space SP6 of FIG. 17 in the direction in which the fin-type active regions FA extend (X-direction).

The upper surface 104 of the fin-type active region FA may be at a first level LV1. The nano-sheet stack structures NSS are spaced apart from the upper surface 104 of the fin-type active region FA. The nano-sheet stack structures NSS may include a plurality of nano-sheets N1, N2, and N3 that are spaced apart from one another, in parallel to the upper surface 104 of the fin-type active region FA, at a second level LV2, which is higher than the first level LV1 with respect to the substrate 102. The nano-sheets N1, N2, and N3 may be modified in various forms, for example, nanowires.

According to an exemplary embodiment, the plurality of nano-sheet stack structures NSS and the plurality of gates 150 are formed on one fin-type active region FA, and the plurality of nano-sheet stack structures NSS are arranged on the one fin-type active region FA in a line along a direction (X-direction) in which the fin-type active region FA extends. However, the present disclosure is not limited to the above embodiment. The number of nano-sheet stack structures NSS disposed on the one fin-type active region FA is not limited to a specific amount. For example, a single nano-sheet stack structure NSS may be formed on a single fin-type active region FA.

The plurality of nano-sheets N1, N2, and N3 constituting the nano-sheet stack structures NSS are each sequentially disposed on the upper surface 104 of the plurality of fin-type active regions FA. According to an exemplary embodiment, one nano-sheet stack structure NSS includes three nano-sheets, N1, N2, and N3, but the present disclosure is not limited thereto. For example, the semiconductor device 100 may include one nano-sheet instead of three nano-sheets N1, N2, and N3. The semiconductor device 100 may include a plurality of nano-sheets selected variously according to desired needs. The plurality of nano-sheets N1, N2, and N3 may each include a channel region.

The plurality of gates 150 may be formed to cover the nano-sheet stack structures NSS and also surround at least a portion of the plurality of nano-sheets N1, N2, and N3, as illustrated in FIG. 3. Each of the plurality of gates 150 may include a main gate portion 150M covering an upper surface of the nano-sheet stack structures NSS and a plurality of sub-gate portions 150S that are connected to the main gate portion 150M and formed in space between the fin-type active region FA and the nano-sheets N1, N2, and N3.

According to an exemplary embodiment, a thickness of each of the plurality of sub-gate portions 150S may be less than a thickness of the main gate portion 150M. According to an embodiment, a thickness of the lowermost sub-gate portion 150S among the plurality of sub-gate portions 150S may be greater than a thickness of the other sub-gate portions 150S. The thickness of the sub-gate portions 150S and the thickness of the main gate portion 150M refer to the thicknesses thereof in a third direction (Z-direction; an upward direction perpendicular to an upper surface of the substrate 102) in FIGS. 1 through 3. According to another embodiment, a length of each sub-gate portion 150S disposed below each of the plurality of nan-sheets N1, N2, and N3 may be greater than a length of the main gate portion 150M in the X-direction parallel to an upper surface of the substrate 102.

A gate insulating layer 145 (or a gate dielectric layer) is formed between the nano-sheet stack structures NSS and the gates 150. The plurality of nano-sheets N1, N2, and N3 may be formed between the fin-type active region FA and the gate 150s, for example, in an overlapping region OR covered by the gate 150. The nano-sheet stack structure NSS including the plurality of nano-sheets N1, N2, and N3 may have a larger planar area than the overlapping region OR in an X-Y plane.

FIG. 1 illustrates the nano-sheet stack structure NSS approximately having a rectangular plane shape, but the present disclosure is not limited thereto. The nano-sheet stack structure NSS may have various planar shapes according to a planar shape of the fin-type active region FA and a planar shape of the gate 150. According to an exemplary embodiment, the plurality of nano-sheets N1, N2, and N3 may be formed of the same material. According to an embodiment, the plurality of nano-sheets N1, N2, and N3 may be formed of the same material as the substrate 102.

A source/drain region 162 is formed on the fin-type active region FA on both sides of the nano-sheets N1, N2, and N3. The source/drain region 162 is connected to an end of the plurality of nano-sheets N1, N2, and N3 that are adjacent to the source/drain region 162. The source/drain region 162 may include a semiconductor layer 162A that is epitaxially grown from the plurality of nano-sheets N1, N2, and N3 by using a selective epitaxial growth (SEG) process. The source/drain region 162 may include, for example, an epitaxially grown Si layer, an epitaxially grown SiC layer or an embedded SiGe structure that includes a plurality of epitaxially grown SiGe layers.

The source/drain region 162 may further include a metal silicide layer 162B formed on the semiconductor layer 162A. According to an embodiment, the metal silicide layer 162B may be formed of titanium silicide, but is not limited thereto. According to an embodiment, the metal silicide layer 162B may be omitted. A gate insulating liner 134, an outer spacer 136, and a gate protection layer 138 that sequentially cover sidewalls of the gates 150 are formed on the nano-sheet stack structures NSS.

The gate protection layer 138 may extend over the plurality of source/drain regions 162. The gate protection layer 138 may include a silicon nitride layer. The gate insulating liner 134, the outer spacer 136, and the gate protection layer 138 may each include a silicon nitride layer, but is not limited thereto. According to an embodiment, the gate protection layer 138 may be omitted. The gate insulating liner 134, the outer spacer 136, and the gate protection layer 138 may cover a sidewall of the main gate portion 150M of the gates 150.

An inner spacer 140 contacting the source/drain region 162 is formed between the plurality of nano-sheets N1, N2, and N3. According to an embodiment, the inner spacer 140 may cover at least some of the sidewalls of the plurality of sub-gate portions 150S. According to an embodiment, the inner spacer 140 may include an insulating layer or a semiconductor layer that is not doped with an impurity. The inner spacer 140 may reduce parasitic capacitance between the gate 150 and the source/drain region 162.

A first source/drain protection layer 143 is formed on a sidewall of the plurality of nano-sheets N1, N2, and N3, between the source/drain region 162 and the nano-sheets N1, N2, and N3. The first source/drain protection layer 143 may be disposed between the source/drain region 162 and the gate 150 in the X-direction. The first source/drain protection layer 143 may also be formed on an upper surface of the fin-type active region FA. The source/drain protection layer 143 may be a semiconductor layer used to protect the source/drain region 162 during a manufacturing process of the semiconductor device 100 such as an etching process. An expanded structure of the inner spacer 140 and the source/drain protection layer 143 will be described in more detail below.

According to an exemplary embodiment, the outer spacer 136 and the inner spacer 140 may include an insulating layer having a surface that prevents seeding of a semiconductor atom and epitaxial growth. An intergate insulating layer 172 and an interlayer insulating layer 174 are sequentially formed on the plurality of source/drain regions 162. The intergate insulating layer 172 and the interlayer insulating layer 174 may each include a silicon oxide layer, but are not limited thereto. A contact plug 190 may be connected to the plurality of source/drain regions 162. The contact plug 190 may be connected to the source/drain region 162 by penetrating the interlayer insulating layer 174, the intergate insulating layer 172, and the gate protection layer 138. The metal silicide layer 162B may be between the semiconductor layer 162A and the contact plug 190.

The contact plug 190 may be formed of a metal, a conductive metal nitride, or a combination thereof. For example, the contact plug 190 may be formed of W, Cu, Al, Ti, Ta, TiN, TaN, an alloy thereof, or a combination thereof, but the present disclosure is not limited to the above-described materials.

Figure 4A:
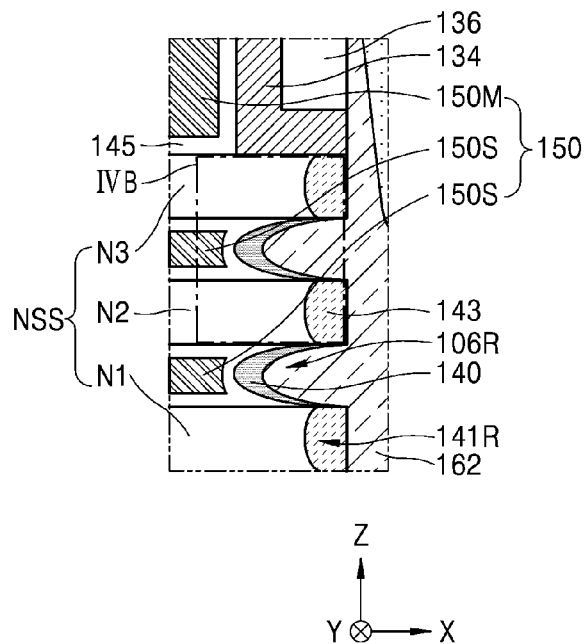
FIG. 4A is an expanded view of a region IV A of FIG. 2.
Figure 4B:
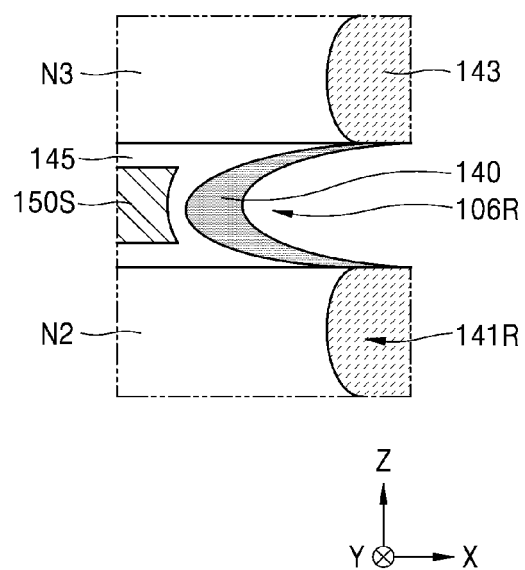
FIG. 4B is an expanded view of a region IV B of FIG. 4A.

FIG. 4A is an expanded view of a region IV A of FIG. 2, and FIG. 4B is an expanded view of a region IV B of FIG. 4A.

According to exemplary embodiments, FIGS. 4A and 4B illustrate a portion of the semiconductor device 100 illustrated in FIGS. 1 through 3, which includes the nano-sheet stack structure NSS, the inner spacer 140, and the source/drain protection layer 143. FIG. 4B is an expanded view of a portion including the inner spacer 140 and the source/drain protection layer 143 of FIG. 4A. For convenience, the source/drain region 162 is not illustrated. In FIGS. 4A and 4B, like reference numerals as those in FIGS. 1 through 3 denote like elements.

As described above, according to an exemplary embodiment, the inner spacer 140 contacting the source/drain region 162 is formed in space between the plurality of nano-sheets N1, N2, and N3 illustrated in FIGS. 1 through 3. The inner spacer 140 may be formed in a recess region 106R recessed from a sidewall of the source/drain protection layer 143 in an X direction.

The inner spacer 140 may be formed in the recess region 106R recessed from a sidewall of the nano-sheets N1, N2, and N3 in an X direction. For example, the inner spacer 140 may be formed in a partial inner portion of the recess region 106R. The recess region 106R having a round shape may be formed from a sidewall of the source/drain protection layer 143 in the X direction. Accordingly, the inner spacer 140 may have a convex and round shape towards the sub-gate portion 150S. For example, a width of the inner spacer 140 adjacent to the sub-gate portion 150S may be larger than a width of the inner spacer 140 adjacent to the sidewall of the source/drain protection layer 143. In some embodiments, the maximum width of the inner spacer 140 in an X direction parallel to an upper surface of the substrate 102 is smaller than the maximum width of the source/drain protection layer 143 in the X direction parallel to the upper surface of the substrate 102.

The inner spacer 140 may be between the sub-gate portion 150S and the source/drain region 162 in spaces between the plurality of nano-sheets N1, N2, and N3. According to an exemplary embodiment, the inner spacer 140 may be formed at least at a side of the plurality of sub-gate portions 150S. According to an exemplary embodiment, the inner spacer 140 may include a silicon nitride layer.

As described above, the source/drain protection layer 143 is formed on a sidewall of the plurality of nano-sheets N1, N2, and N3, between the source/drain region 162 and the nano-sheets N1, N2, and N3. The source/drain protection layer 143 may be formed in a sheet recess region 141R that is recessed from a sidewall of the outer spacer 136 defining the nano-sheet stack structures NSS or the nano-sheets N1, N2, and N3 in the first direction (−X direction). For example, the source/drain protection layer 143 may be formed in the sheet recess region 141R recessed from a sidewall of the nano-sheets N1, N2, and N3 in an X direction.

The sheet recess region 141R may have a round shape with respect to a sidewall of the nano-sheets N1, N2, and N3 in an X-direction. Accordingly, the source/drain protection layer 143 may have a convex and round shape towards the sub-gate portion 150S. According to an exemplary embodiment, the source/drain protection layer 143 may be a regrowth layer that is regrown on a sidewall of the plurality of nano-sheets N1, N2, and N3. According to an exemplary embodiment, the source/drain protection layer 143 may be an epitaxial regrowth layer. According to an exemplary embodiment, the source/drain protection layer 143 may be an epitaxially regrown silicon layer or a silicon layer that is epitaxially regrown and not doped with an impurity.

FIGS. 5A through 5D are expanded views of an inner spacer and a source/drain protection layer of a semiconductor device according to an embodiment of the present disclosure.

In detail, in FIGS. 5A through 5D, like reference numerals as those in FIGS. 1 through 3 and FIGS. 4A and 4B denote like elements. With reference to FIGS. 5A through 5D, description provided above with reference to FIGS. 4A and 4B will be briefly provided or omitted.

Figure 5A:
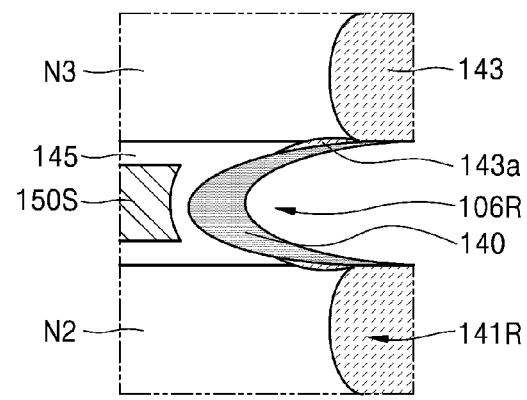
FIGS. 5A through 5D are expanded views of an inner spacer and a source/drain protection layer of a semiconductor device according to an exemplary embodiment of the present disclosure.

Referring to FIG. 5A, as described above, a first source/drain protection layer 143 is formed in a sheet recess region 141R that is recessed from a sidewall of the nano-sheets N1, N2, and N3 in the first direction (−X direction). In addition, a second source/drain protection layer 143a is further formed between the inner spacer 140 and the nano-sheets N1, N2, and N3 at a side of the inner spacer 140. Accordingly, the first and second source/drain protection layers 143 and 143a may better protect the source/drain region 162 of FIG. 4A in a manufacturing process of the semiconductor device 100, for example, during an etching process.

Figure 5B:
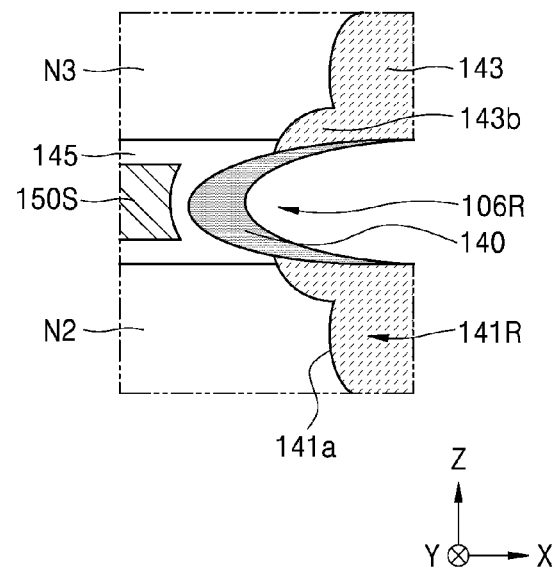

Referring to FIG. 5B, a third source/drain protection layer 143b having a greater thickness than the first source/drain protection layer 143 is formed between the inner spacer 140 and the nano-sheets N1, N2, and N3, at a side of the inner spacer 140, in the first direction (−X direction). The first and third source/drain protection layers 143 and 143b may be connected to each other and may have a curved surface 141a. Accordingly, the first and third source/drain protection layers 143 and 143b may better protect the source/drain region 162 of FIG. 4A in a manufacturing process of the semiconductor device 100, for example, in an etching process.

Figure 5C:
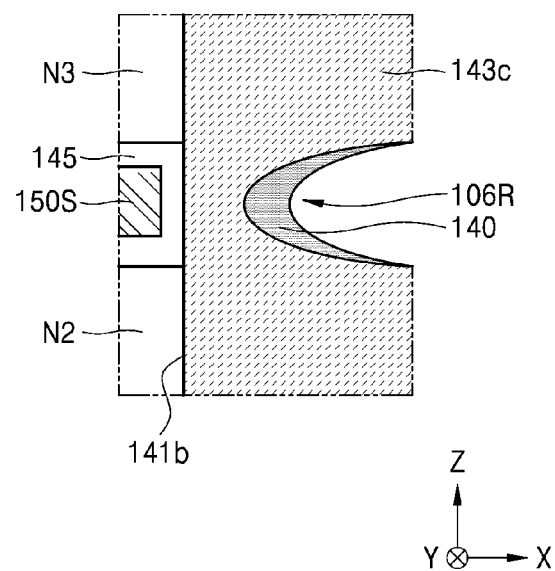

Referring to FIG. 5C, a fourth source/drain protection layer 143c is formed at a deeper depth than the first source/drain protection layer 143 on a sidewall of the nano-sheets N1, N2, and N3 compared to FIG. 5A, in the first direction (−X direction). The fourth source/drain protection layer 143c may be a regrowth layer that is epitaxially regrown using an epitaxial method after forming a sheet recess region in the nano-sheets N2 and N3 at a deeper depth in the first direction (−X direction).

The fourth source/drain protection layer 143c is formed in the first direction between the inner spacer 140 and the gate 150S (or the gate insulating layer 145). The fourth source/drain protection layer 143c may have a planar surface 141b at one side. Accordingly, the fourth source/drain protection layer 143c may better protect the source/drain region 162 (FIG. 4A) in a manufacturing process of the semiconductor device 100, for example, during an etching process.

Figure 5D:
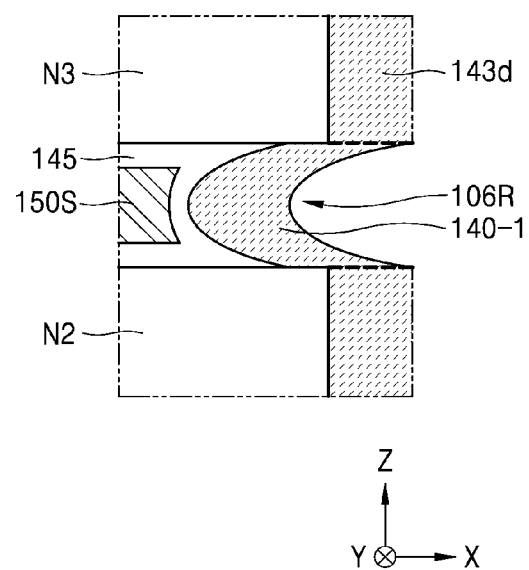

Referring to FIG. 5D, a fifth source/drain protection layer 143d is formed on a sidewall of the nano-sheets N1, N2, and N3. As described above, a recess region 106R recessed from a sidewall of the nano-sheets N1, N2, and N3 in an X direction is formed. An inner spacer 140-1 is formed in the recess region 106R.

The fifth source/drain protection layer 143d and the inner spacer 140-1 may be formed as a single unit. The fifth source/drain protection layer 143d and the inner spacer 140-1 may be a regrowth layer that is epitaxially regrown using an epitaxial method after forming the recess region 106R. According to an embodiment, the fifth source/drain protection layer 143d and the inner spacer 140-1 may be an epitaxially regrown silicon layer that is not doped with an impurity.

Figure 6:
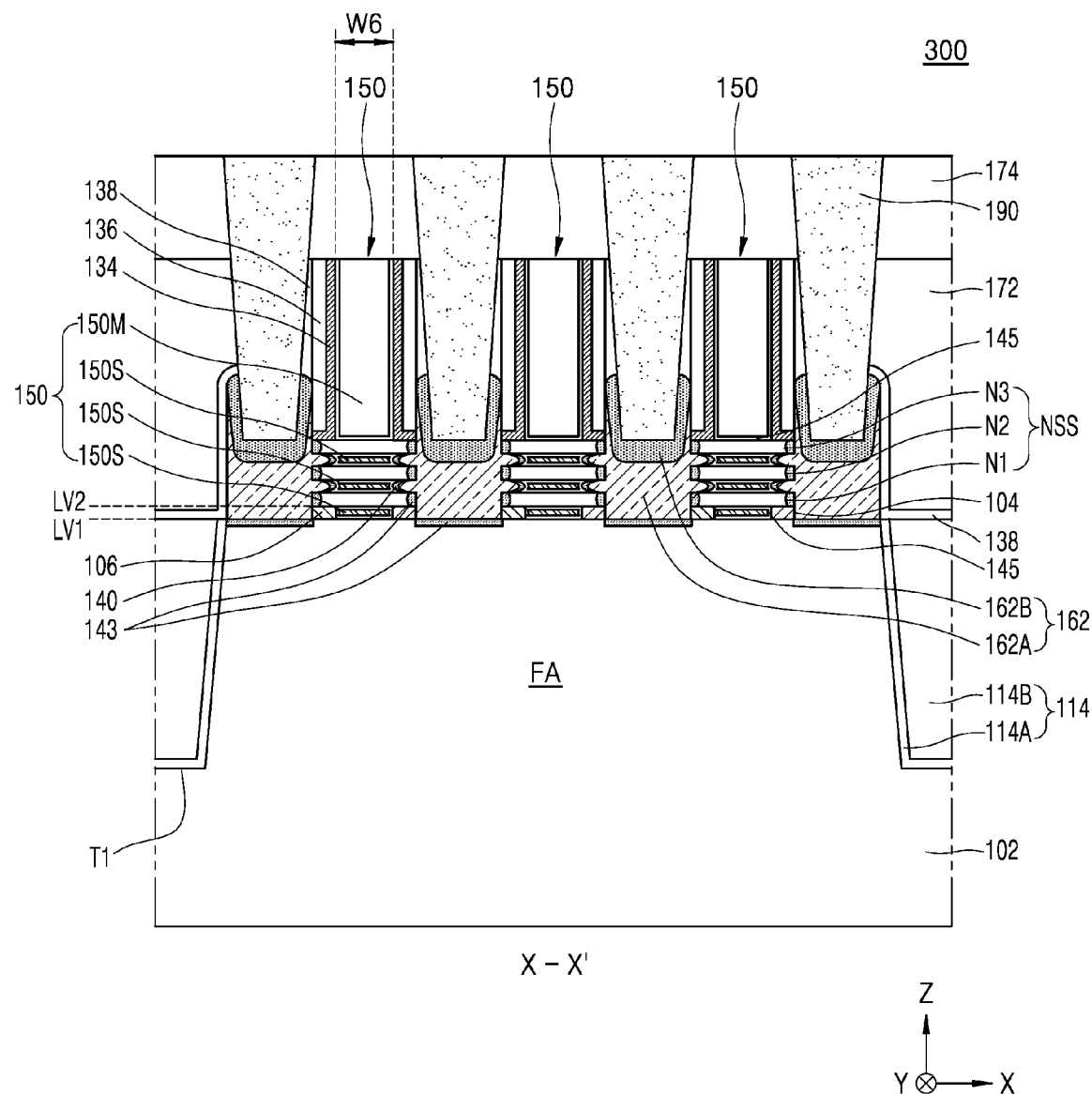
FIG. 6 is a cross-sectional view of a semiconductor device according to exemplary an embodiment of the present disclosure.

FIG. 6 is a cross-sectional view of a semiconductor device 300 according to an embodiment of the present disclosure.

In detail, the semiconductor device 300 of FIG. 6 may be a cross-sectional view of FIG. 1 taken along a line X-X'. In the semiconductor device 300 of FIG. 6, the cross-sectional view of FIG. 1 taken along a line Y-Y' is the same as that of FIG. 3, and thus will be omitted. In FIG. 6, like reference numerals as those in FIGS. 1 through 3 denote like elements, and thus description already provided above will be omitted or briefly provided.

The semiconductor device 300 may be the same as the semiconductor device 100 of FIGS. 1 through 3 except that the thicknesses of three sub-gate portions 150S are identical in a direction perpendicular to an upper surface of the substrate 102, and that a buffer semiconductor layer 106 is formed on two sidewalls of the sub-gate portion 150S that is closest to the fin-type active region FA from among the three sub-gate portions 150S.

In the semiconductor device 300, two sidewalls of the sub-gate portion 150S that is closest to the fin-type active region FA, from among the three sub-gate portions 150S, may be formed as the buffer semiconductor layer 106 covering the upper surface 104 of the fin-type active region FA.

According to an embodiment, the buffer semiconductor layer 106 may be formed of a different material from materials of the fin-type active region FA and the plurality of nano-sheets N1, N2, and N3. According to an embodiment, the fin-type active region FA and the nano-sheets N1, N2, and N3 may be formed of silicon, and the buffer semiconductor layer 106 may be formed of Ge. According to an embodiment, the buffer semiconductor layer 106 may include a sacrificial semiconductor layer which will be described below, for example, a SiGe layer.

FIGS. 7 through 19 are cross-sectional views for explaining a method of manufacturing a semiconductor device, according to an embodiment of the present disclosure.

In detail, FIGS. 7 through 19 illustrate an exemplary method of manufacturing the semiconductor device 100 illustrated in FIGS. 1 through 3. Cross-sectional views of FIGS. 7 through 19 respectively correspond to a cross-section of the semiconductor device 100 of FIG. 1 taken along a line X-X'. With reference to FIGS. 7 through 19, like reference numerals as those of FIGS. 1 through 3 denote like elements, and description already provided above will be briefly provided or omitted.

Figure 7:
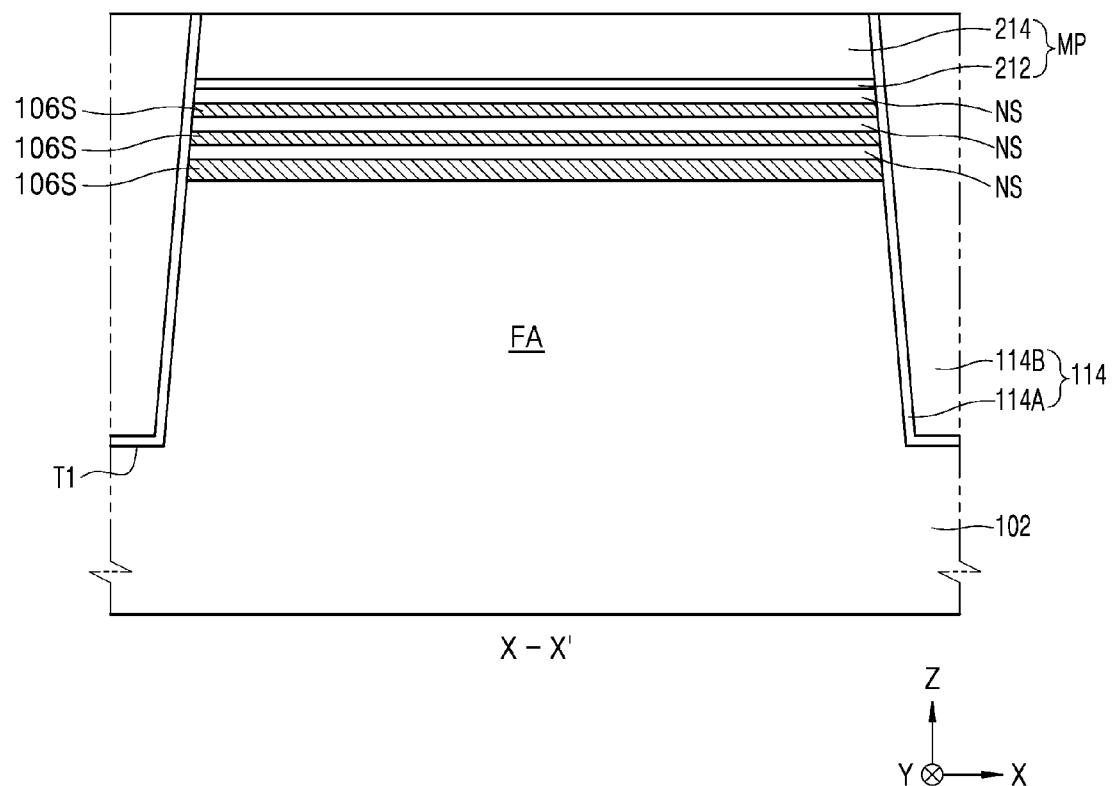
FIGS. 7 through 19 are cross-sectional views for explaining a method of manufacturing a semiconductor device, according to an exemplary embodiment of the present disclosure.

Referring to FIG. 7, a plurality of sacrificial semiconductor layers 106S and a plurality of nano-sheet semiconductor layers NS are each alternately stacked on a substrate 102. The sacrificial semiconductor layers 106S and the nano-sheet semiconductor layers NS may be formed using an epitaxial growth method.

The substrate 102 may include a semiconductor such as Si or Ge or a compound semiconductor such as SiGe, SiC, GaAs, InAs, or InP. According to an embodiment, the substrate 102 may be formed of one of a Group III-V material and a Group IV material.

Group III-V materials may be a binary, ternary or quaternary compound including at least one Group III element and at least one Group V element. The Group III-V material may be a compound including at least one of In, Ga, and Al as a group III element and at least one of As, P, and Sb as a group V element.

For example, a Group III-V material may be selected from the group consisting of InP, $In_zGa_{1-z}As$ ($0 \leq z \leq 1$), and $Al_zGa_{1-z}As$ ($0 \leq z \leq 1$). A binary compound may be, for example, one of InP, GaAs, InAs, InSb, and GaSb. A ternary compound may be, for example, one of InGaP, InGaAs, AlInAs, InGaSb, GaAsSb, and GaAsP. The Group IV material may be Si or Ge. However, Group III-V materials and Group IV materials that may be used in a semiconductor device according to the present disclosure are not limited to the above materials.

The Group III-V materials and the Group IV materials such as Ge may also be used as a channel material used to manufacture a transistor having low power consumption and a high speed. A semiconductor substrate formed of a Group III-V material having a higher electron mobility than a Si substrate, such as GaAs, and a semiconductor substrate having a higher hole mobility than a Si substrate, such as, Ge, may be used to manufacture a high-performance complementary metal oxide semiconductor (CMOS) transistor.

According to an embodiment, when forming an NMOS transistor on the substrate 102, the substrate 102 may be formed of one of the Group III-V materials described above. According to an embodiment, when forming a PMOS transistor on the substrate 102, at least a portion of the substrate 102 may be formed of Ge. According to an embodiment, the substrate 102 may have a silicon on insulator (SOI) structure. The substrate 102 may include a conductive region such as an impurity-doped well or an impurity-doped structure.

The plurality of sacrificial semiconductor layers 106S and the plurality of nano-sheet semiconductor layers NS may be formed of different semiconductor materials. In some embodiments, the sacrificial semiconductor layers 106S may be formed of SiGe, and the nano-sheet semiconductor layers NS may be formed of Si, but the layers are not limited thereto.

According to an embodiment, a sacrificial semiconductor layer 106S that is closest to the substrate 102 from among the plurality of sacrificial semiconductor layers 106S may have a greater thickness than the other sacrificial semiconductor layers 106S. However, the present disclosure is not limited thereto. For example, the plurality of sacrificial semiconductor layers 106S may all have the same thickness.

Next, a mask pattern MP is formed on the stack structure including the plurality of sacrificial semiconductor layers 106S and the nano-sheet semiconductor layers NS. The mask pattern MP may include a pad oxide layer pattern 212 and a hard mask pattern 214. The hard mask pattern 214 may be formed of silicon nitride, polysilicon, a spin-on-hard mask (SOH) material, or a combination thereof, but is not limited to thereto. According to an embodiment, an SOH material may be formed of a hydrocarbon compound having a relatively high carbon content of about 85 w % to about 99 wt % with respect to the total weight of the SOH material, or a derivative thereof.

A stack structure including the plurality of sacrificial semiconductor layers 106S and a plurality of nano-sheet semiconductor layers NS is formed by using the mask pattern MP as an etching mask, and a plurality of first trenches T1 are formed by etching a portion of the substrate 102. Accordingly, a plurality of fin-type active regions FA defined by the plurality of first trenches T1 may be formed. After the plurality of fin-type active regions FA are formed, the stack structure including the plurality of sacrificial semiconductor layers 106S and the plurality of nano-sheet semiconductor layers NS remains on the plurality of fin-type active regions FA.

A shallow trench insolation (STI) layer 114 is formed in the plurality of first trenches T1. The STI layer 114 may include a trench insulating liner 114A that conformally covers an inner wall of the first trench T1 and a gap-fill insulating layer 114B on the trench insulating liner 114A and filling the first trench T1.

According to an exemplary embodiment, the trench insulating liner 114A covering the inner wall of the first trench T1 may include an oxide layer, silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), silicon dioxide ($SiO_2$), polysilicon, or a combination thereof. According to an embodiment, the trench insulting liner 114A may have a thickness of about 10 Å to about 100 Å.

According to an exemplary embodiment, the gap-fill insulating layer 114B may include an oxide layer. According to an embodiment, the gap-fill insulating layer 114B may include an oxide layer formed using a deposition process or a coating process. According to an embodiment, the gap-fill insulating layer 114B may include an oxide layer formed using a flowable chemical vapor deposition (FCVD) process or a spin coating process. For example, the gap-fill insulating layer 114B may be formed of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazane (TOSZ), but is not limited thereto.

Next, some structures may be etched from a resultant product including the fin-type active region FA and the STI layer 114, so as to form a second trench T2 defining a device region DR and an isolation layer 116 in the second trench T2 as illustrated in FIG. 3.

Figure 8:
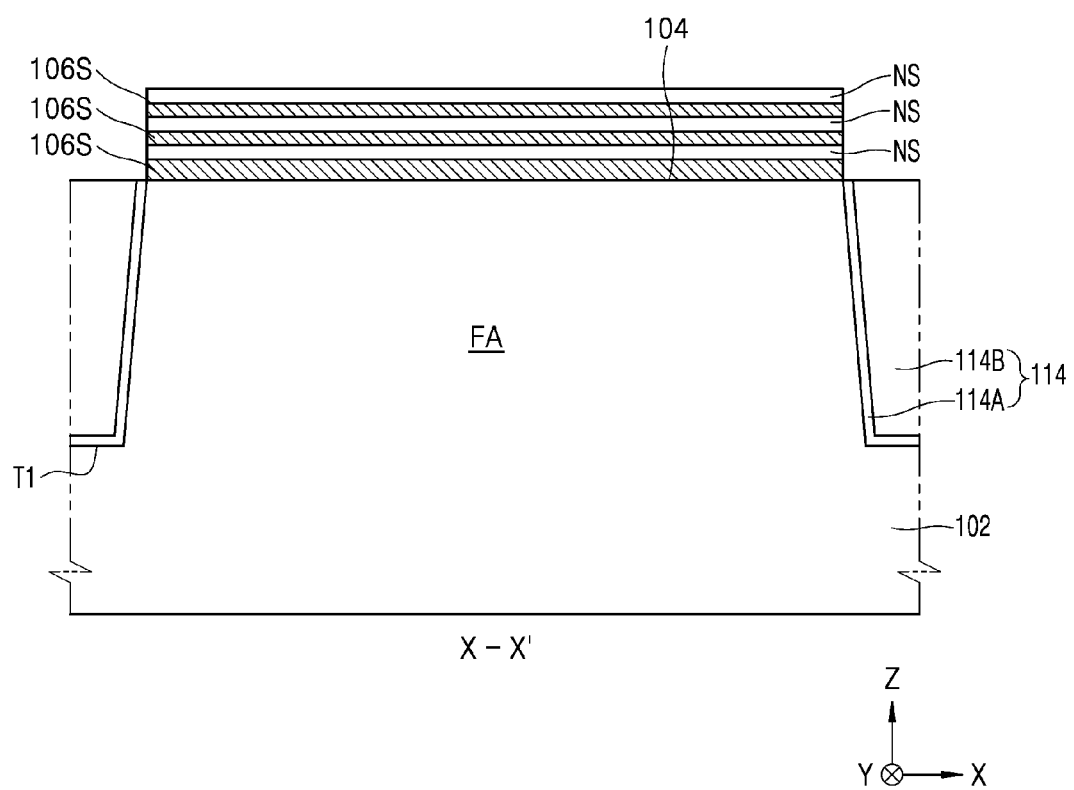

Referring to FIG. 8, the mask pattern MP remaining on the stack structure including the plurality of sacrificial semiconductor layers 106S and the plurality of nano-sheet semiconductor layers NS is removed, and then a recess process is performed to remove a portion of each upper portion of the STI layer 114 and the isolation layer 116 by a predetermined thickness.

The recess process may be performed such that each upper surface of the STI layer 114 and the isolation layer 116 is substantially the same as or similar to a level of the upper surface 104 of the fin-type active region FA. As a result, a sidewall of the stack structure including the plurality of sacrificial semiconductor layers 106S and the plurality of nano-sheet semiconductor layers NS on the plurality of fin-type active regions FA may be exposed. In order to perform the recess process, a dry etching method, a wet etching method or a combination of the dry and wet etching methods may be used.

In some exemplary embodiments, after the mask pattern MP is removed, before the recess process is performed to remove the upper portions of the STI layer 114 and the isolation layer 116, an impurity ion injection process for injecting impurity ions for adjusting threshold voltages may be performed on the upper portions of the plurality of nano-sheet semiconductor layers NS and the plurality of fin-type active areas FA. According to an exemplary embodiment, during the impurity ion injection process for injecting impurity ions for adjusting threshold voltages, boron (B) ions may be injected into an area in which an NMOS transistor is formed as impurities, and phosphor (P) or arsenic (As) ions may be injected into an area in which a PMOS transistor is formed as impurities.

Figure 9:
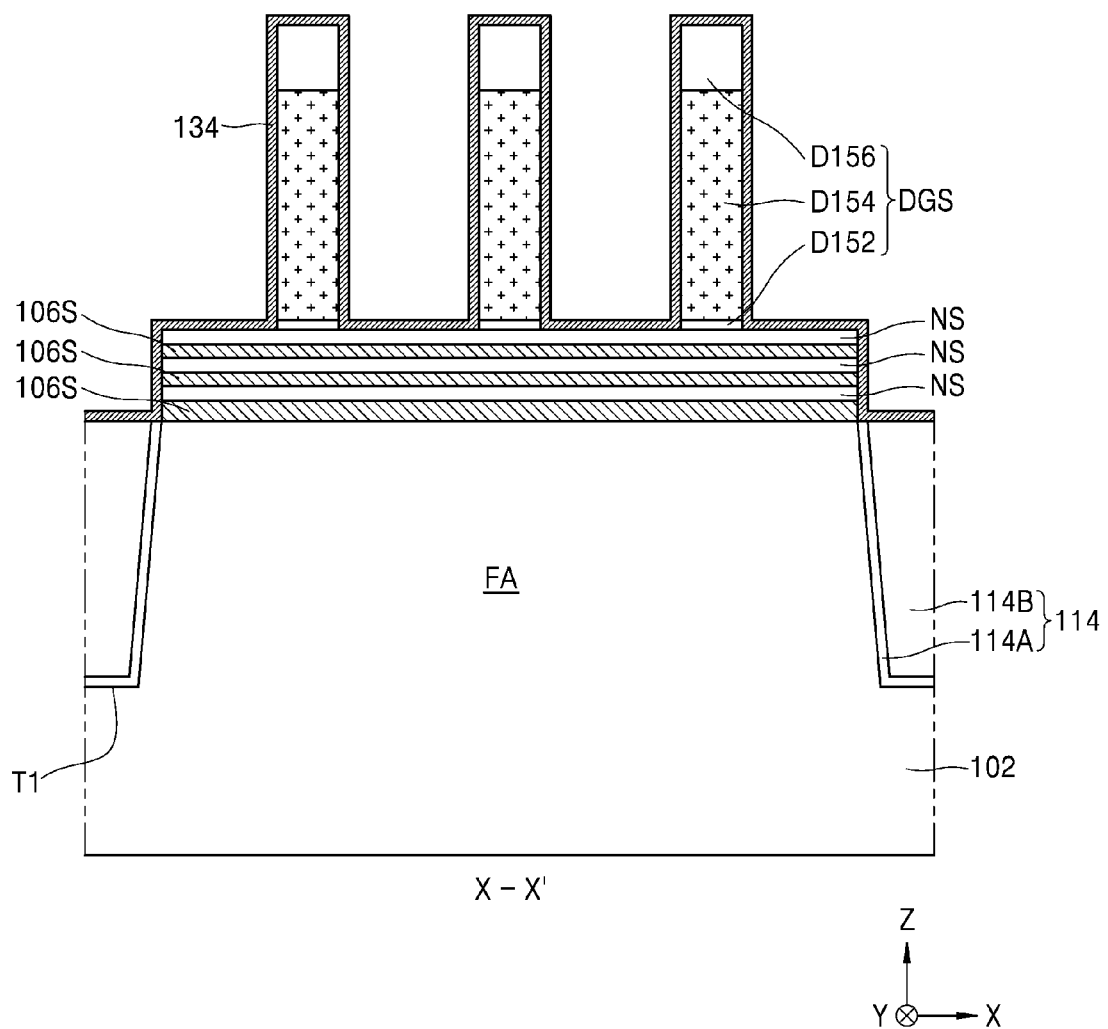

Referring to FIG. 9, a plurality of dummy gate structures DGS intersecting the plurality of fin-type active regions FA and extending on the plurality of fin-type active regions FA are formed. The dummy gate structures DGS may include an oxide layer D152, a dummy gate layer D154, and a capping layer D156 that are sequentially stacked in this order. In an exemplary embodiment of forming the dummy gate structure DGS, the oxide layer D152, the dummy gate layer D154, and the capping layer D156 may be sequentially formed to cover an exposed surface of the stack structure including the plurality of sacrificial semiconductor layers 106S and the plurality of nano-sheet semiconductor layers NS covering the plurality of fin-type active regions FA, an upper surface of the STI layer 114, and an upper surface of the isolation layer 116, and then may be patterned so that the oxide layer D152, the dummy gate layer D154, and the capping layer D156 remain only in necessary portions. The dummy gate structure DGS may have a planar shape corresponding to a planar shape of the gate 150 illustrated in FIG. 1. According to an embodiment, the dummy gate layer D154 may be formed of polysilicon, and the capping layer D156 may include a silicon nitride layer, but is not limited thereto.

Next, a gate insulating liner 134 covering the exposed surface of the dummy gate structure DGS, the exposed surface of the stack structure including the plurality of sacrificial semiconductor layers 106S and the plurality of nano-sheet semiconductor layers NS, and each upper surface of the STI layer 114 and the isolation layer 116 is formed. According to an embodiment, the gate insulating liner 134 may include a silicon nitride layer.

Figure 10:
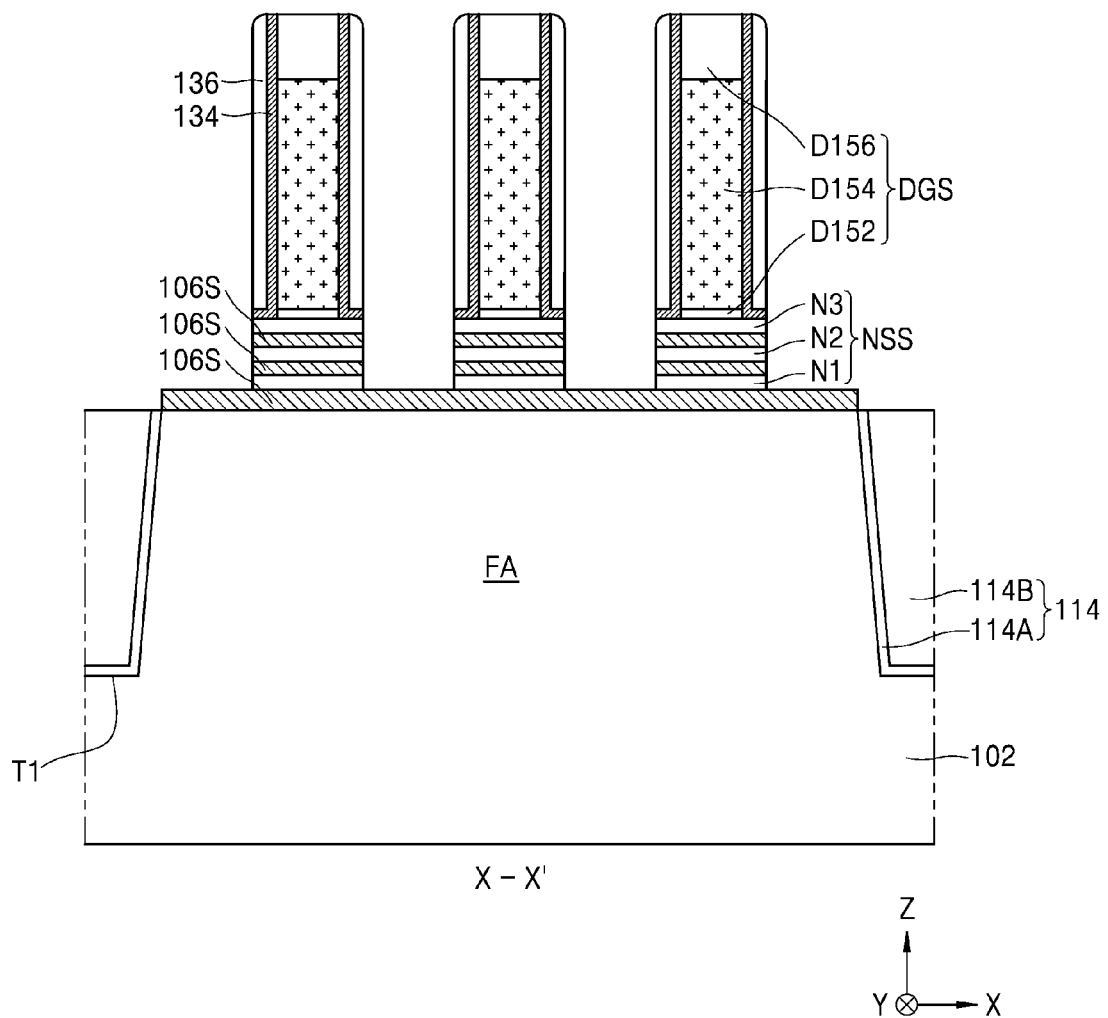

Referring to FIG. 10, an outer spacer 136 covering two sidewalls of the dummy gate structure DGS is formed, and by using the dummy gate structure DGS and the outer spacer 136 as an etching mask, a portion of the stack structure including the plurality of sacrificial semiconductor layers 106S and the plurality of nano-sheet semiconductor layers NS is removed by etching, thereby forming a plurality of nano-sheet stack structures NSS including a plurality of nano-sheets N1, N2, and N3 from the plurality of nano-sheet semiconductor layers NS.

In order to form the outer spacer 136, a spacer layer formed of silicon nitride may be formed on the resultant product of FIG. 9, on which the gate insulating liner 134 is formed, and then the spacer layer may be etch-backed so that the outer spacer 136 remains.

According to an embodiment, the stack structure including the plurality of sacrificial semiconductor layers 106S and the plurality of nano-sheet semiconductor layers NS may be etched so that a lowermost sacrificial semiconductor layers 106S from among the plurality of sacrificial semiconductor layers 106S is exposed.

Accordingly, after the plurality of nano-sheet stack structures NSS are formed, the sacrificial semiconductor layers 106S covering the fin-type active regions FA may be exposed between each of the plurality of nano-sheet stack structures NSS. After the plurality of nano-sheet stack structures NSS are formed, the sacrificial semiconductor layers 106S may remain between the fin-type active regions FA and the plurality of nano-sheet stack structures NSS and between the plurality of nano-sheets N1, N2, and N3.

Figure 11:
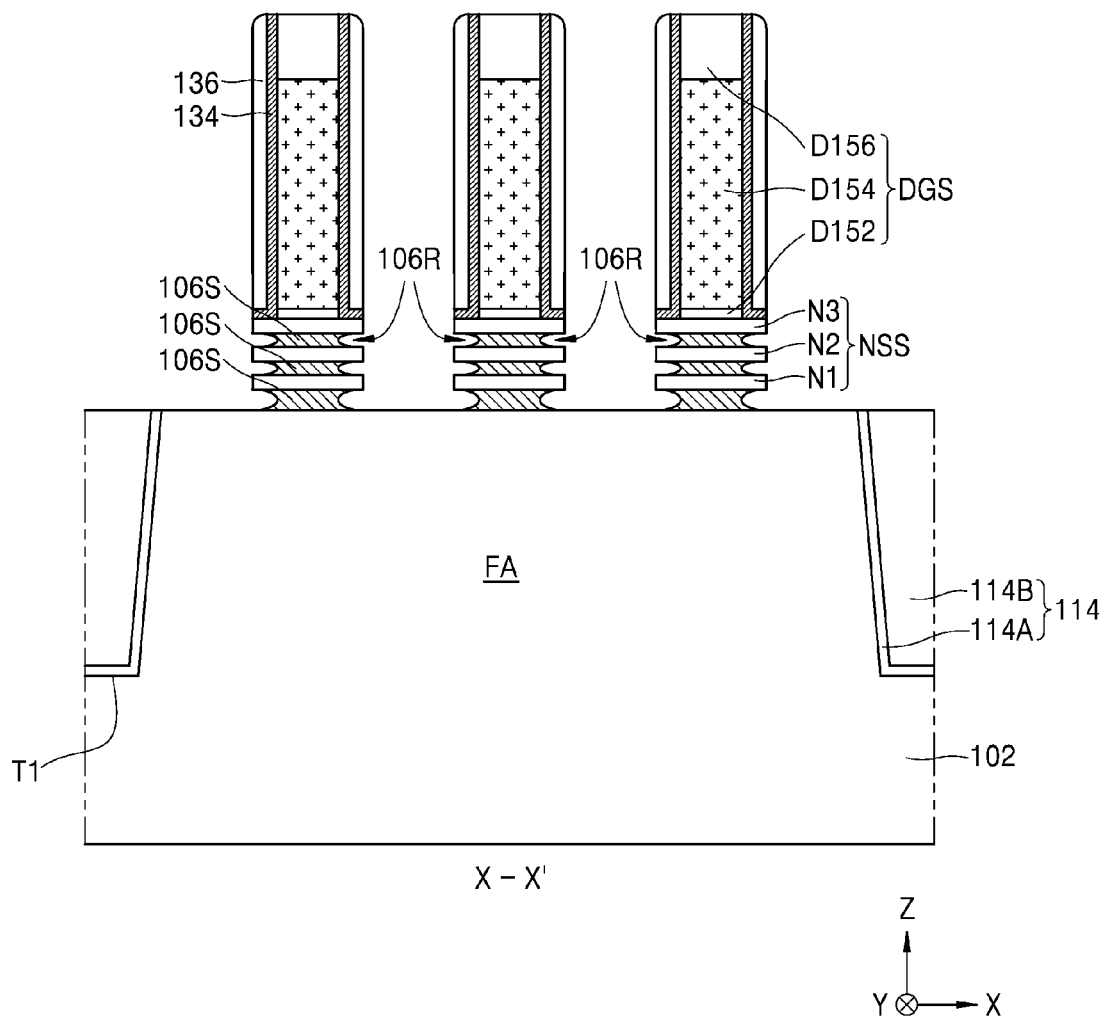

Referring to FIG. 11, an etching process is performed to remove a portion of the plurality of sacrificial semiconductor layers 106S exposed on both sides of the plurality of nano-sheet stack structures NSS, thereby forming a recess region 106R between the plurality of nano-sheets N1, N2, and N3. According to an exemplary embodiment, the etching process to remove a portion of the plurality of sacrificial semiconductor layers 106S may be an isotropic etching process.

According to an exemplary embodiment, while the recess region 106R is formed, a portion of the lowermost sacrificial semiconductor layer 106S covering the fin-type active region FA between each of the plurality of nano-sheet stack structures NSS may be removed from the upper surface thereof completely or partially.

According to an exemplary embodiment, an isotropic etching process for forming the recess region 106R may be performed using a wet etching process in which a difference in etching selectivities between the sacrificial semiconductor layers 106S and the nano-sheets N1, N2, and N3 is used. For example, when the sacrificial semiconductor layer 106S is formed of SiGe, and the nano-sheet semiconductor layer NS is formed of Si, the recess region 106R may be formed by using an etchant having a faster etching speed for SiGe than Si.

Figure 12:
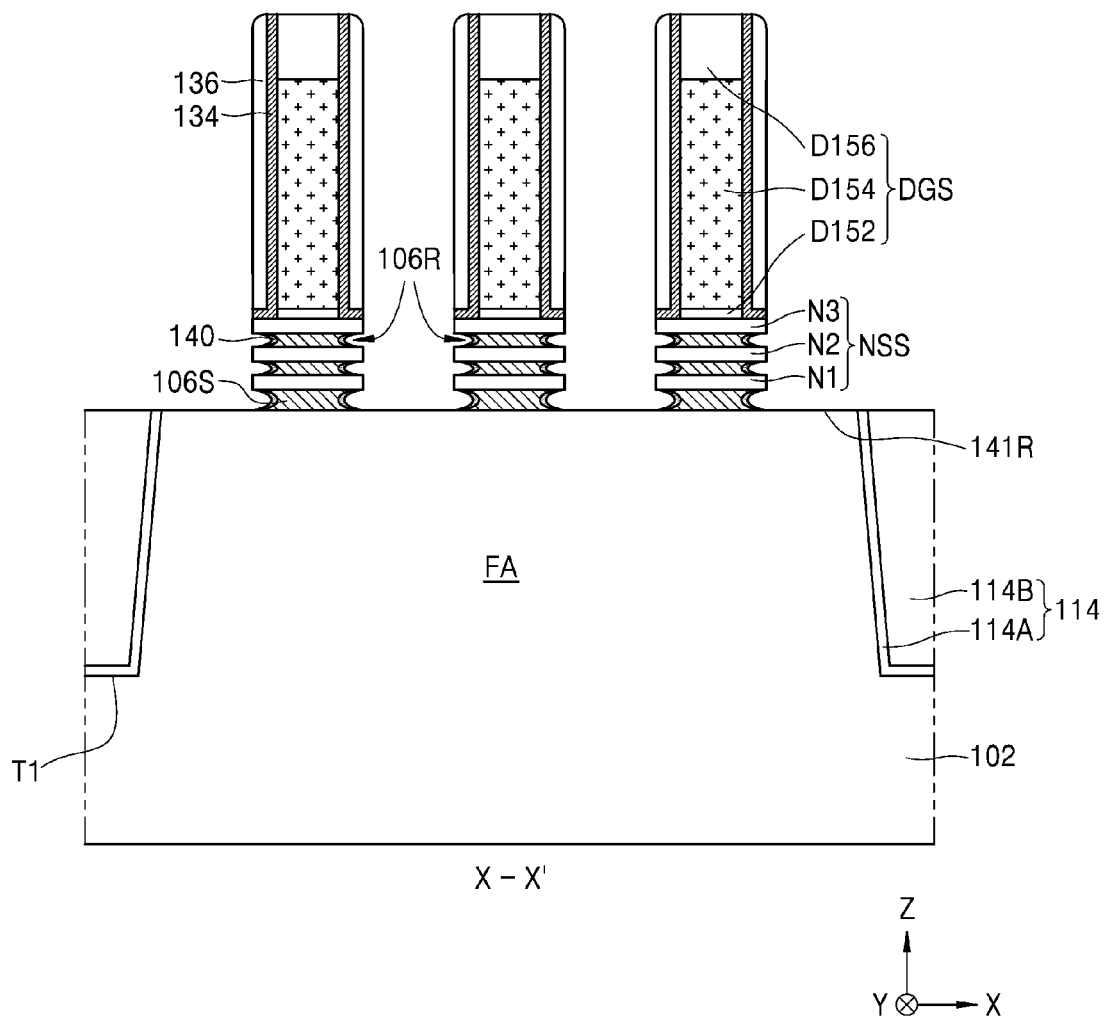

Referring to FIG. 12, an inner spacer 140 is formed on an inner wall of the recess region 106R (see FIG. 10) formed between the plurality of nano-sheets N1, N2, and N3. According to an exemplary embodiment, the inner spacer 140 may include a silicon nitride layer. According to an embodiment, the inner spacer 140 may include a plurality of insulating layers. According to an embodiment, the inner spacer 140 may include at least one material selected from the group consisting of SiCN, SiBN, SiON, SiOCN, SiBCN, SiOC, and SiO$_2$.

The inner spacer 140 may be formed by removing a portion remaining in the outer portion of the recess region 106R after forming an insulating layer on the entire surface of the resultant product of FIG. 11. According to an embodiment, the inner spacer 140 may have a round shape towards the sacrificial semiconductor layer 106S. According to an embodiment, the inner spacer 140 may be filled in the recess region 106R.

Figure 13:
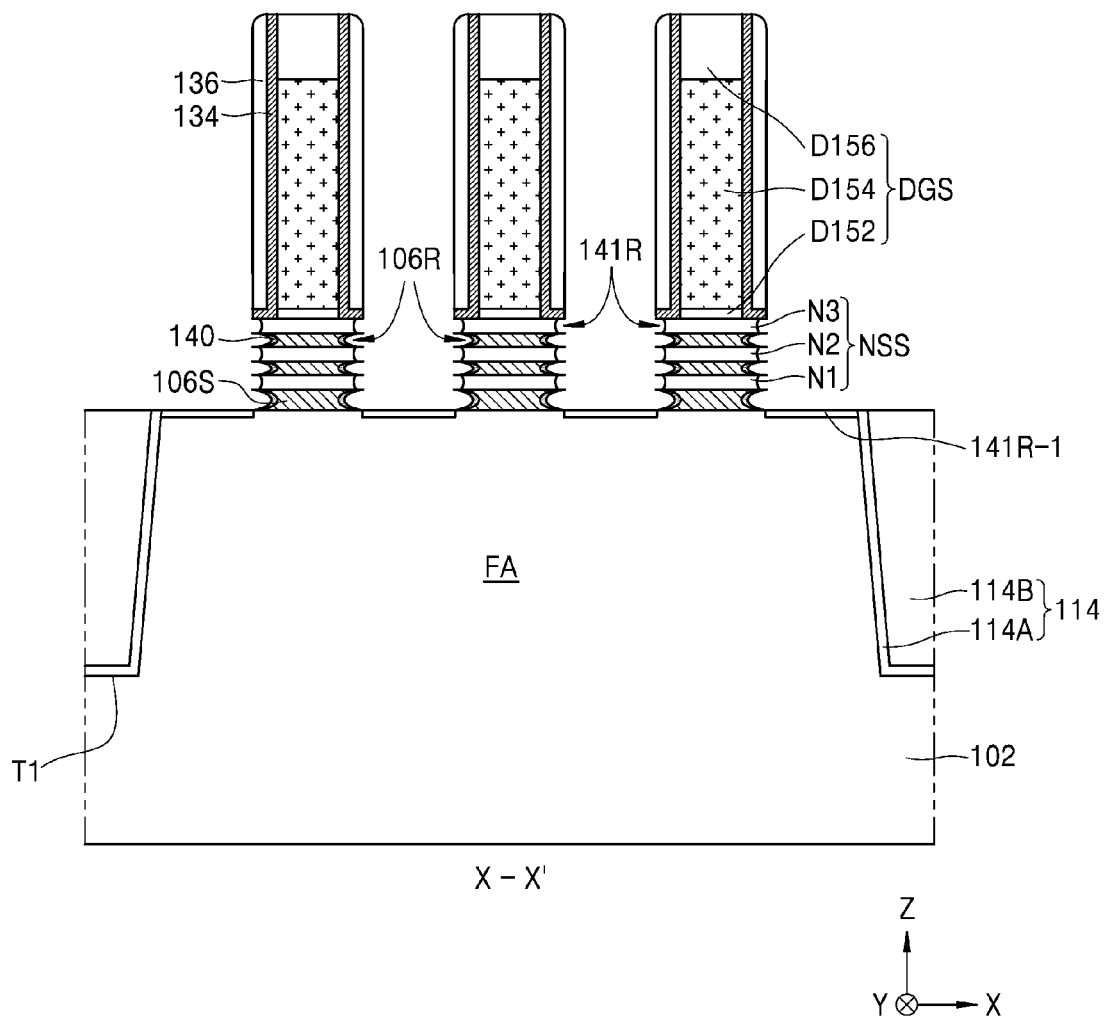

Referring to FIG. 13, a sheet recess region 141R is formed by recessing a sidewall of the plurality of nano-sheets N1, N2, and N3. The sheet recess region 141R is formed on a side of each of the plurality of nano-sheets N1, N2, and N3 by removing a portion of the nano-sheets N1, N2, and N3 exposed on both sides of each of the plurality of nano-sheet stack structures NSS by using an isotropic etching process.

According to an embodiment, while the sheet recess region 141R is formed, a portion of a surface of the fin-type active region FA may be etched to form a surface recess region 141R-1. According to an embodiment, an isotropic etching process for forming the sheet recess region 141R may be performed using a wet etching process in which a difference in etching selectivities between the plurality of sacrificial semiconductor layers 106S, the plurality of nano-sheets N1, N2, and N3, and the inner spacer 140 is used.

Figure 14:
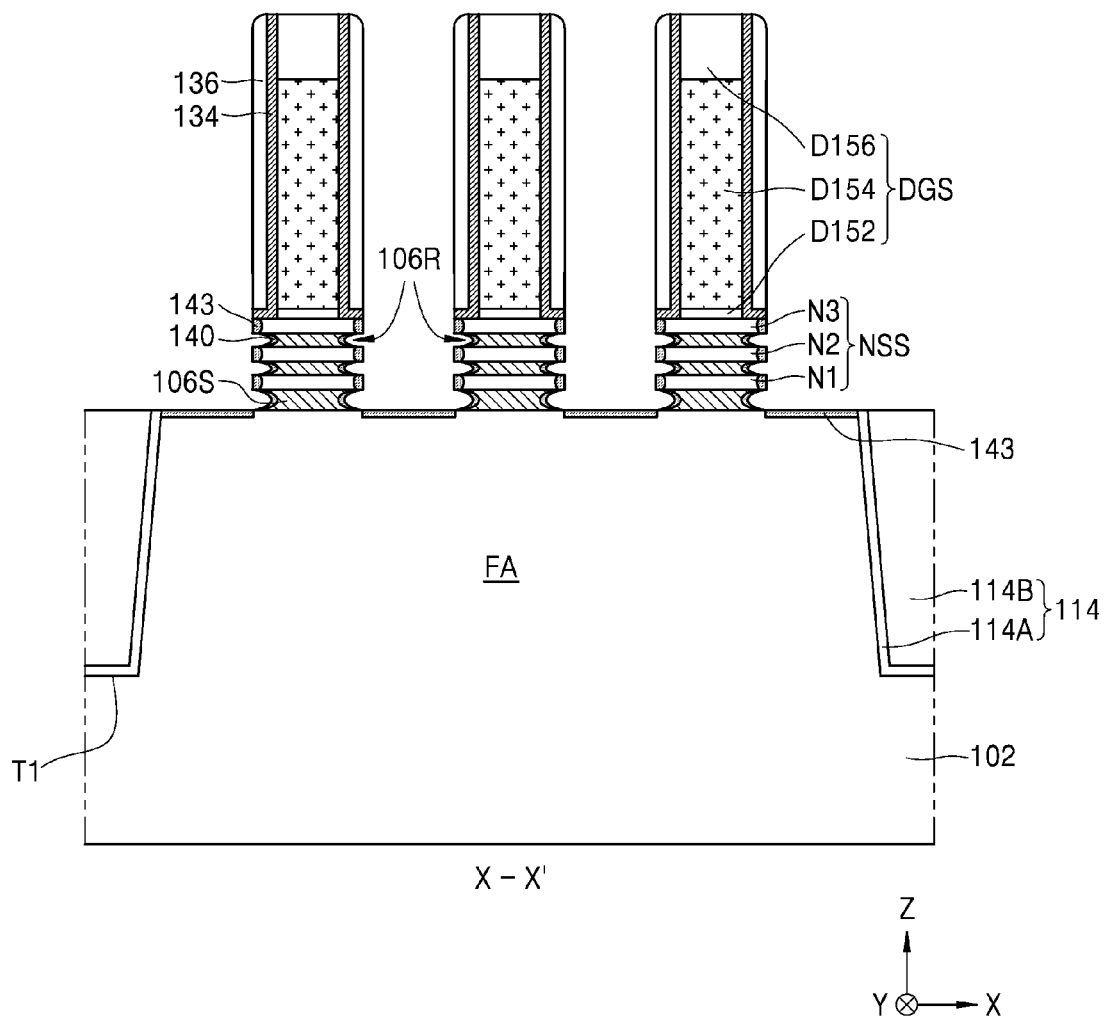

Referring to FIG. 14, a source/drain protection layer 143 is formed on a sidewall of the plurality of nano-sheets N1, N2, and N3 in the sheet recess region 141R. The source/drain protection layer 143 may be a regrowth layer that is regrown on a sidewall of the plurality of nano-sheets N1, N2, and N3 by using an epitaxial growth method. According to an exemplary embodiment, the source/drain protection layer 143 may be a silicon layer or a silicon layer that is not doped with an impurity.

While forming the source/drain protection layer 143 on a sidewall of the plurality of nano-sheets N1, N2, and N3, the source/drain protection layer may also be formed in the surface recess region 141R-1 of an upper surface of the fin-type active region FA. The source/drain protection layer 143 may be a semiconductor layer used to protect the source/drain region 162 (FIGS. 1 through 3) in a subsequent manufacturing process such as an etching process. Furthermore, two exposed sidewalls of the plurality of nano-sheets N1, N2, and N3 and an exposed surface of the substrate 102 are cleansed to remove a natural oxide layer.

Figure 15:
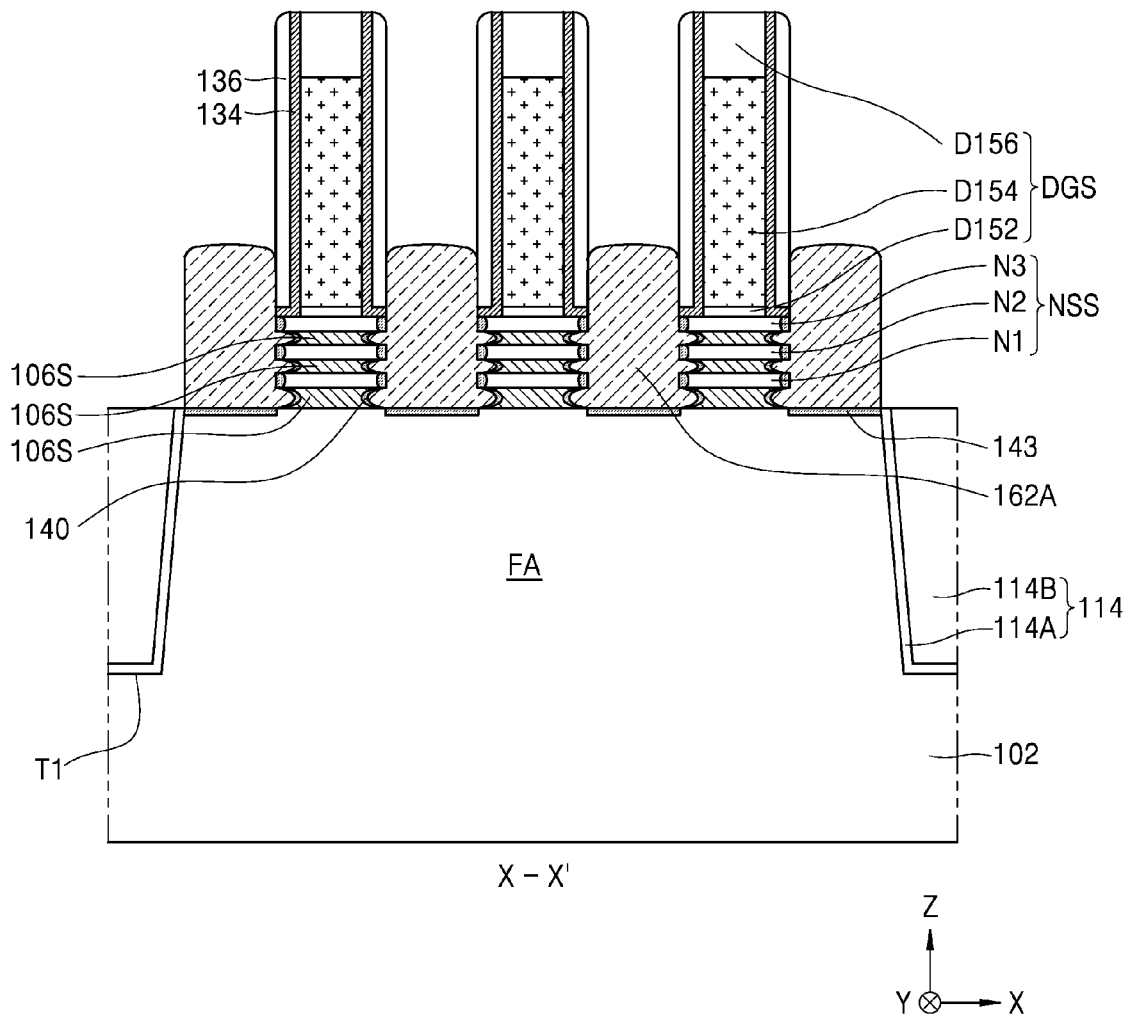

Referring to FIG. 15, a semiconductor material is epitaxially grown from the two exposed sidewalls of the plurality of nano-sheets N1, N2, and N3 and a surface of the substrate 102 to form a semiconductor layer 162A to be used in forming the source/drain region 162 (FIG. 2).

The outer spacer 136 and the inner spacer 140 may include insulating layers, on surfaces of which seeding of a semiconductor atom and epitaxial growth are not possible. Accordingly, an epitaxial growth process for forming the semiconductor layer 162A may be performed only from the two exposed sidewalls of the plurality of nano-sheets N1, N2, and N3 and the exposed surface of the substrate 102.

Figure 16:
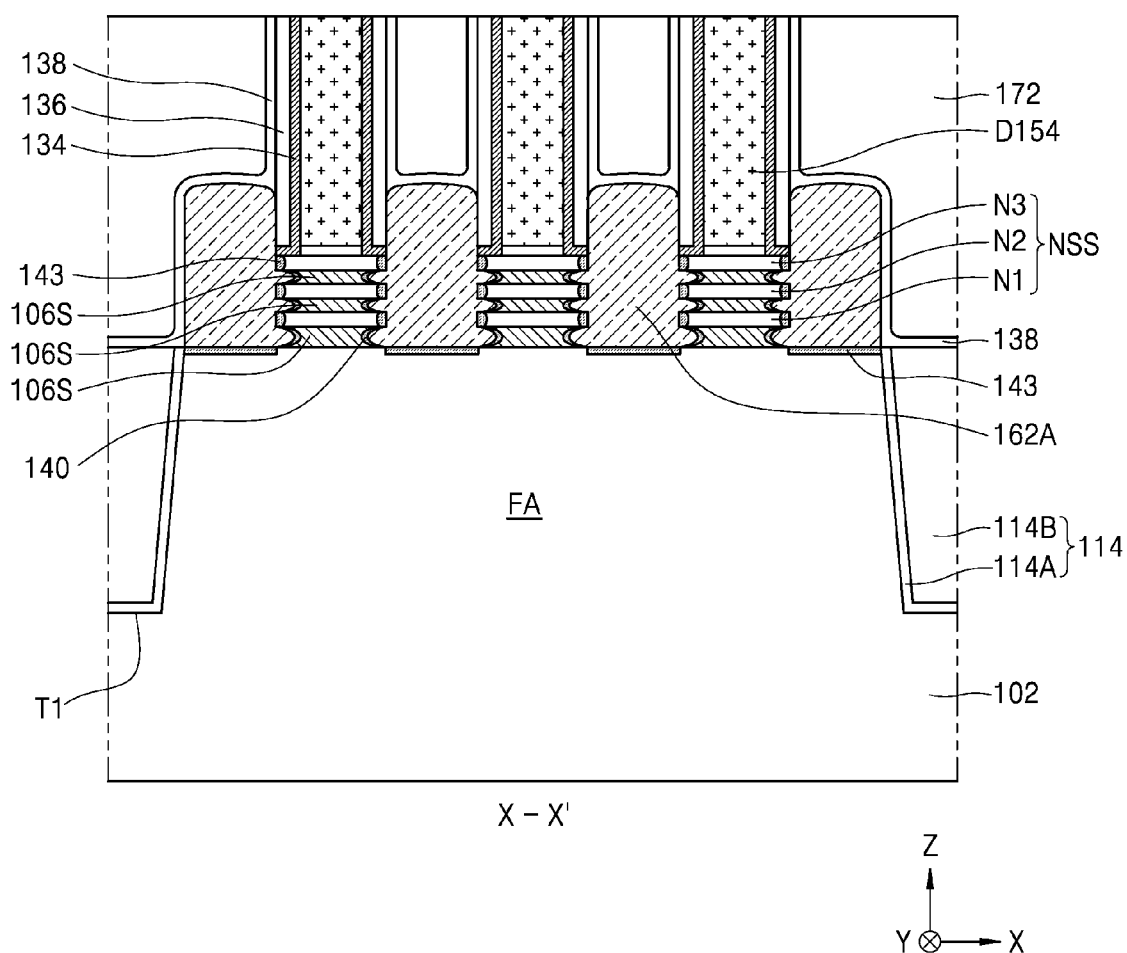

Referring to FIG. 16, a gate protection layer 138 covering the resultant product including the semiconductor layer 162A is formed. According to an embodiment, the gate protection layer 138 may include a silicon nitride layer. In order to form the gate protection layer 138, an atomic layer deposition (ALD) process or a chemical vapour deposition (CVD) process may be used.

After forming an intergate insulating layer 172 on the gate protection layer 138, the intergate insulating layer 172 is planarized to expose an upper surface of the capping layer D156 of FIG. 14. Next, the capping layer D156, and the gate insulating liner 134, the outer spacer 136, and the gate protection layer 138 around the capping layer D156 are etch-backed, and then the intergate insulating layer 172 is polished from an upper portion thereof by a predetermined thickness, so that an upper surface of the intergate insulating layer 172 is approximately at the same or similar level as an upper surface of the dummy gate layer D154.

Figure 17:
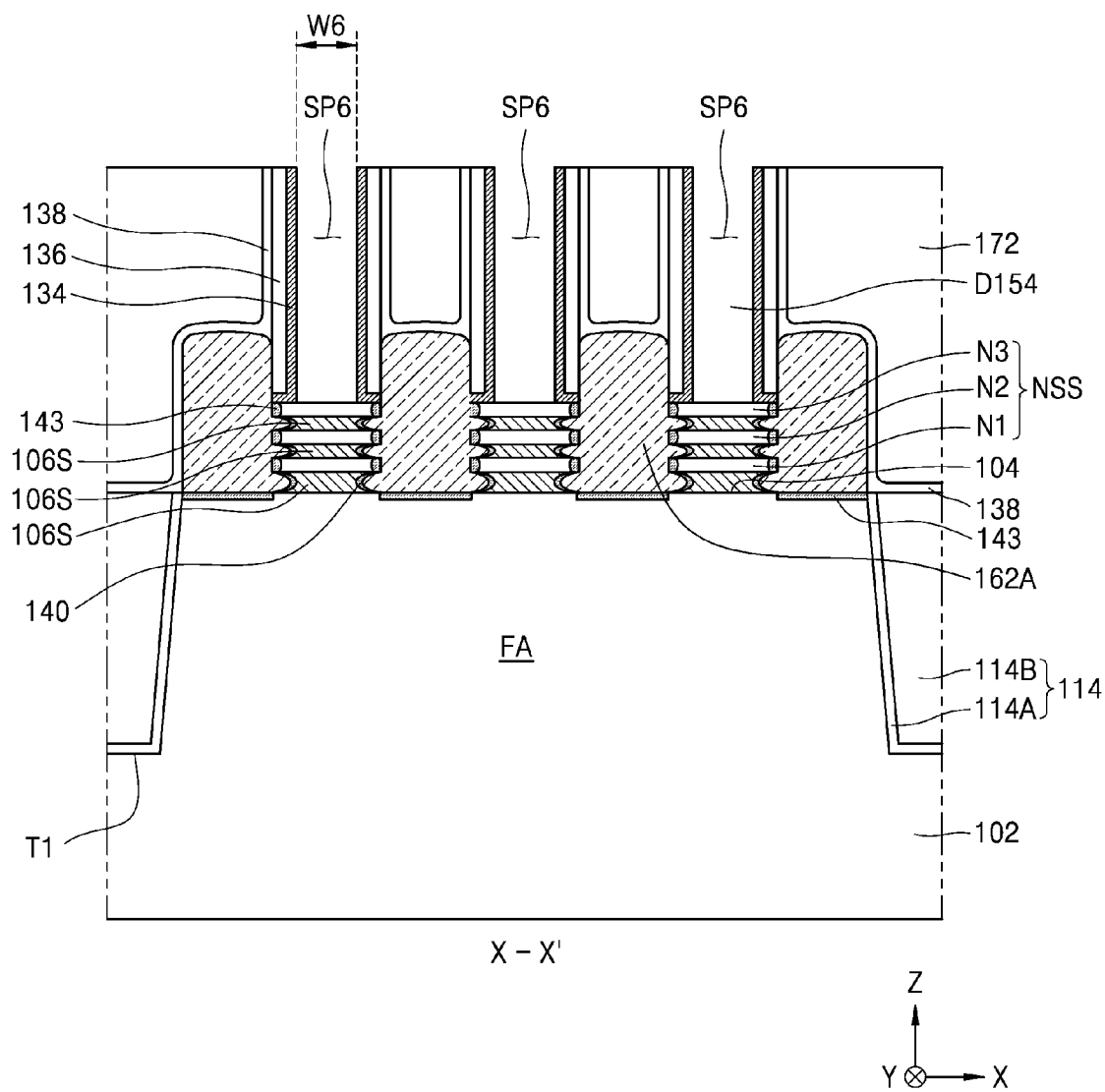

Referring to FIG. 17, a gate structure space SP6 is formed by removing the dummy gate layer D154 and the oxide layer D152 therebelow, which are exposed through the intergate insulating layer 172. The gate insulating liner 134 and the nano-sheet N3 may be exposed through the gate structure space SP6.

A wet etching process may be used to remove the dummy gate layer D154 and the oxide layer D152 therebelow. While the wet etching process is performed, a pair of gate insulating liners 134 defining a width W6 of the gate structure space SP6 may be exposed to an etchant. The gate insulating liner 134 is formed of a material having a relatively high carbon content, and thus is highly resistant to the etchant.

Accordingly, even when the gate insulating liner 134 is exposed to the etchant, the gate insulating liner 134 may remain without being substantially consumed by the etchant. Accordingly, the width W6 of the gate structure space SP6 may be maintained at a constant level.

Figure 18:
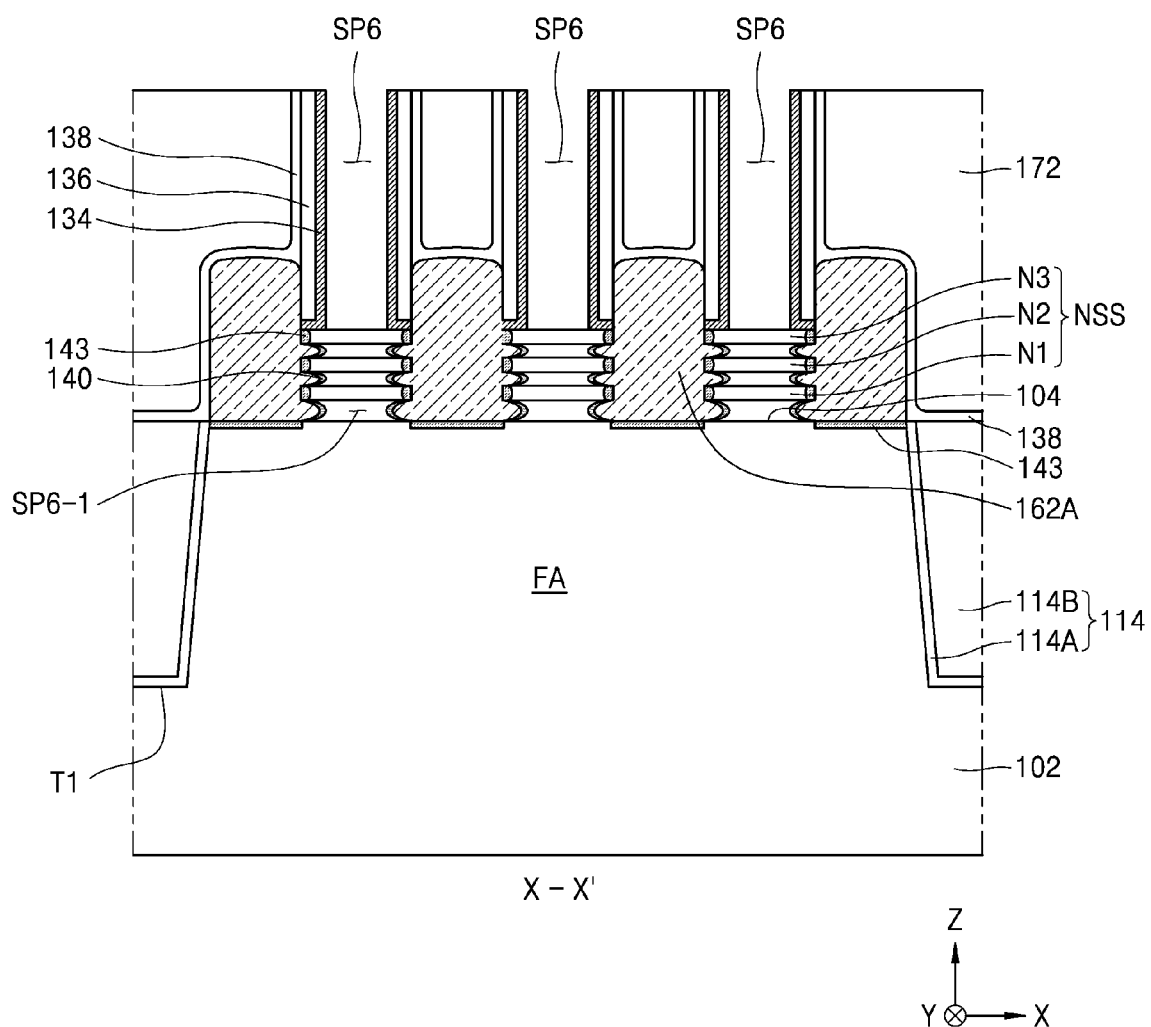

Referring to FIG. 18, the plurality of sacrificial semiconductor layers 106S remaining on the fin-type active region FA are removed using the gate structure space SP6, thereby exposing the nano-sheets N1, N2, and N3 and a portion of the upper surface 104 of the fin-type active region FA. A gate structure space SP6-1 may be formed between the nano-sheets N1, N2, and N3.

A wet etching process may be used to remove the sacrificial semiconductor layer 106S by using the gate structure space SP6. While performing the wet etching process, the inner spacer 140 may be exposed to an etchant. The inner spacer 140 is formed of a material having a relatively high carbon content, and is thus highly resistant to the etchant.

Accordingly, even when the inner spacer 140 is exposed to the etchant, the inner spacer 140 may not be substantially consumed by the etchant but may be left unchanged. In addition, as will be described in more detail below, damage to the semiconductor layer 162A during wet etching may be reduced by using the source/drain protection layer 143.

Figure 19:
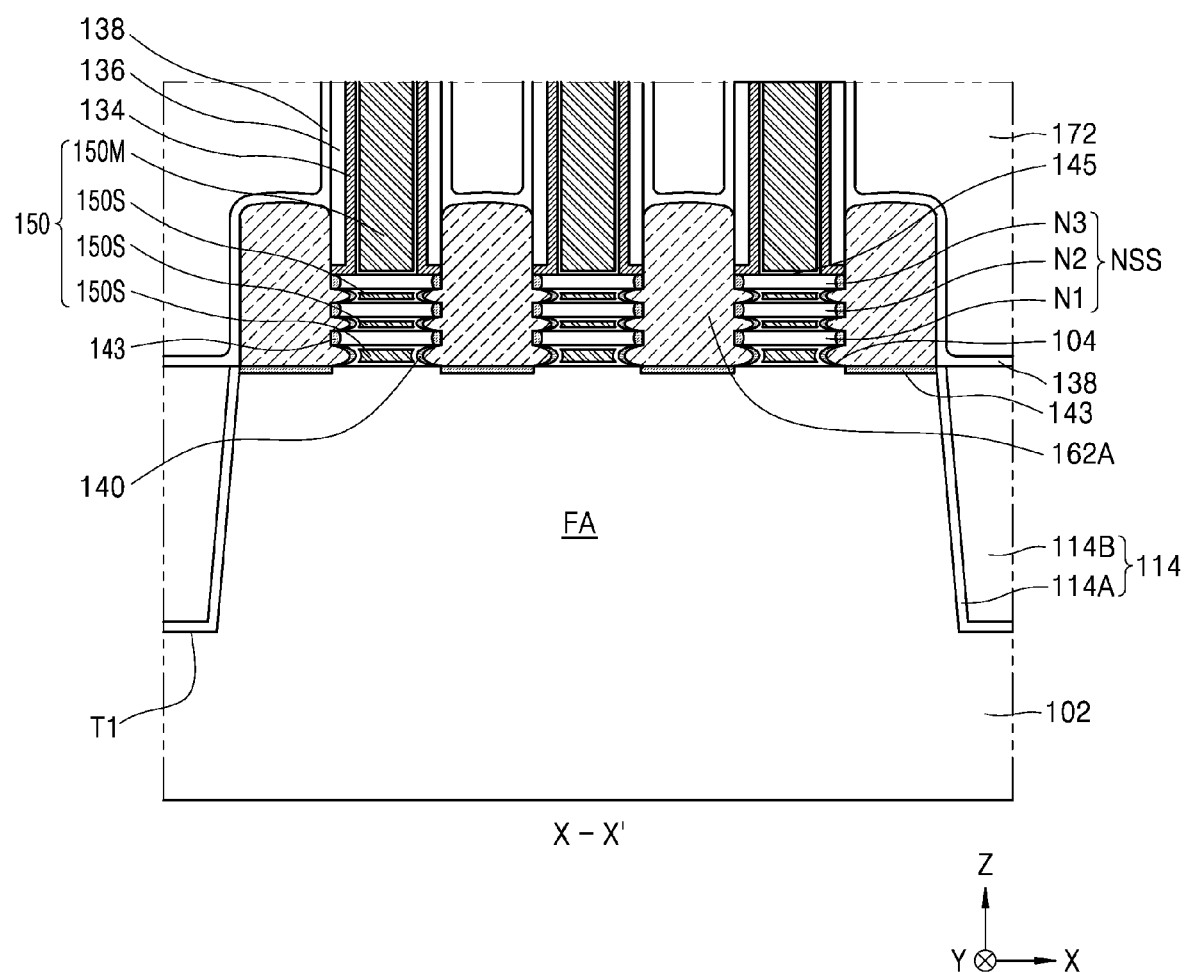

Referring to FIG. 19, after removing the natural oxide layer from the plurality of nano-sheets N1, N2, and N3 and an exposed surface of the fin-type active region FA, a gate insulating layer 145 is formed on surfaces exposed in the gate structure spaces SP6 and SP6-1 of FIG. 18.

The gate insulating layer 145 may have a stack structure including an interfacial layer and a high-k dielectric layer. The interfacial layer may perform the function of curing interfacial defects on an upper surface of the fin-type active region FA and surfaces of the plurality of nano-sheets N1, N2, and N3.

According to an embodiment, the interfacial layer may include a low-k material layer having a permittivity of about 9 or less, such as a silicon oxide layer, a silicon oxynitride layer, a Ga oxide layer, a Ge oxide layer or a combination thereof. According to an exemplary embodiment, the interfacial layer may be formed of a silicate, a combination of silicate and a silicon oxide layer, or a combination of silicate and a silicon oxynitride layer. According to an embodiment, the interfacial layer may be omitted.

The high-k dielectric layer may be formed of a material having a higher dielectric constant than a silicon oxide layer. For example, the high-k dielectric layer may have a dielectric constant of about 10 to about 25. The high-k dielectric layer may be formed of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate or a combination thereof, but is not limited thereto. The high-k dielectric layer may be formed using an ALD method, a CVD method, or a physical vapour deposition (PVD) method. The high-k dielectric layer may have a thickness of about 10 Å to about 40 Å, but is not limited thereto.

A gate 150 that fills the gate structure spaces SP6 and SP6-1 on the gate insulating layer 145 and covers the nano-sheet stack structures NSS is formed. The gate 150 may include a main gate portion 150M covering an upper surface of the nano-sheet stack structure NSS including the plurality of nano-sheets N1, N2, and N3 and a sub-gate portion 150S that is connected to the main gate portion 150M and is formed in space between the nano-sheets N1, N2, and N3.

The gate 150 may include a work-function adjusting metal-containing layer, and a gap-fill metal-containing layer that fills an upper space of the work function-adjusting metal-containing layer. According to an embodiment, the gate 150 may have a structure in which a metal nitride layer, a metal layer, a conductive capping layer, and a gap-fill metal layer are sequentially stacked. The metal nitride layer and the metal layer may each include at least one metal selected from the group consisting of Ti, W, Ru, Nb, Mo, Hf, Ni, Co, Pt, Yb, Tb, Dy, Er, and Pd. The metal nitride layer and the metal layer may each be formed using an ALD method, a metal organic ALD (MOALD) method, or a metal organic CVD (MOCVD) method.

The conductive capping layer may function as a protection layer preventing oxidization of a surface of the metal layer. In addition, the conductive capping layer may function as a wetting layer to facilitate deposition when another conductive layer is deposited on the metal layer. The conductive capping layer may be formed of a metal nitride such as TiN or TaN or a combination thereof, but is not limited thereto.

The gap-fill metal layer may extend on the conductive capping layer. The gap-fill metal layer may include a W layer. The gap-fill metal layer may be formed using an ALD, CVD or a PVD process. The gap-fill metal layer may fill, without any voids, a recess space that is formed in a step portion between regions on an upper surface of the conductive capping layer. According to an embodiment, a conductive layer for forming a gate may have a TiAlC/TiN/W stack structure, a TiN/TaN/TiAlC/TiN/W stack structure, or a TiN/TaN/TiN/TiAlC/TiN/W stack structure. In the stack structures, a TiAlC layer or a TiN layer may function as a metal-containing layer for adjusting a work function.

Next, as illustrated in FIG. 2, after forming the interlayer insulating layer 174 covering the gate 150 and the intergate insulating layer 172, a plurality of contact holes exposing the plurality of semiconductor layers 162A are formed by etching a portion of the interlayer insulating layer 174 and the intergate insulating layer 172. Next, a metal silicide layer 162B is formed on an upper surface of the plurality of semiconductor layers 162A exposed through the plurality of contact holes, and a plurality of contact plugs 190 respectively connected to the semiconductor layers 162A through the metal silicide layer 162B are formed, thereby forming the semiconductor device 100 illustrated in FIGS. 1 through 3.

Figure 20A:
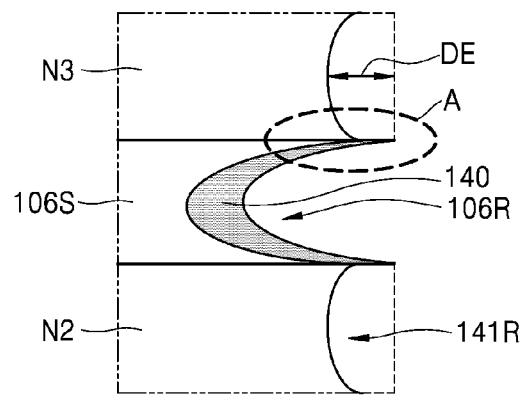
FIGS. 20A and 20B are cross-sectional views for explaining a method of forming an inner spacer and a source/drain protection layer, according to an exemplary embodiment of the present disclosure.
Figure 20B:
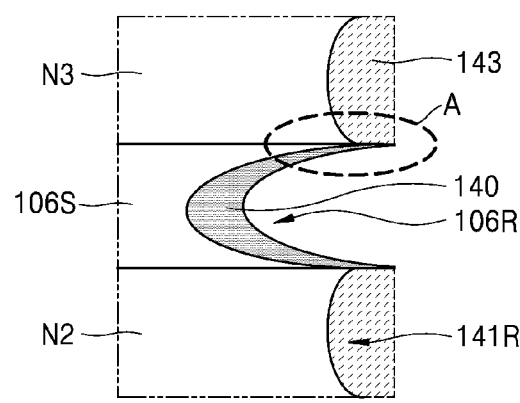

FIGS. 20A and 20B are cross-sectional views for explaining a method of forming an inner spacer and a source/drain protection layer, according to an embodiment of the present disclosure.

In detail, FIGS. 20A and 20B illustrate a process of forming the inner spacer 140 and the source/drain protection layer 143 of FIGS. 11 through 14. As illustrated in FIG. 20A, a recess region 106R is formed between the plurality of nano-sheets N2 and N3, and the inner spacer 140 is formed in the recess region 106R.

The recess region 106R may be formed using an isotropic etching process, and may be formed convex towards the sacrificial semiconductor layer 106S. The inner spacer 140 may be in contact with the sacrificial semiconductor layer 106S in the recess region 106R. The inner spacer 140 may be relatively thick in a center portion of the recess region 106R and the inner spacer 140 in an edge portion A of the recess region 106R, for example, an entry portion may be relatively thin.

Accordingly, when isotropically etching the sacrificial semiconductor layer 106S of FIG. 18, an etchant may penetrate the edge portion A and damage the semiconductor layer 162A or the source/drain region 162. In order to address this issue, as illustrated in FIG. 20A, a sheet recess region 141R is formed by recessing a sidewall of the plurality of nano-sheets N2 and N3. A depth DE of the sheet recess region 141R may be variously adjusted.

Next, as illustrated in FIG. 20B, the source/drain protection layer 143 is formed in the sheet recess region 141R on a sidewall of the nano-sheets N2 and N3 by using an epitaxial growth method. The source/drain protection layer 143 may reinforce an edge portion A of the recess region 106R, for example, an entry portion, thereby preventing damage to the semiconductor layer 162A or the source/drain region 162 due to penetration of an etchant during isotropic etching of the sacrificial semiconductor layer 106S of FIG. 18.

In addition, when forming the sheet recess region 141R by recessing a sidewall of the plurality of nano-sheets N2 and N3, etching for the sidewall of nano-sheets N2 and N3 may be performed at a deeper level, and regrowing of an epi-layer, i.e., a silicon layer using an epitaxial method, and accordingly, the fourth source/drain protection layer 143c as illustrated in FIG. 5C may be formed.

In addition, when an epi-layer, i.e., a silicon layer is regrown using an epitaxial method without forming the inner spacer 140 in the recess region 106R as illustrated in FIG. 20A, the fifth source/drain protection layer 143d and an inner spacer 140-1 that are formed as a single unit as illustrated in FIG. 5D may be formed.

Figure 21A:
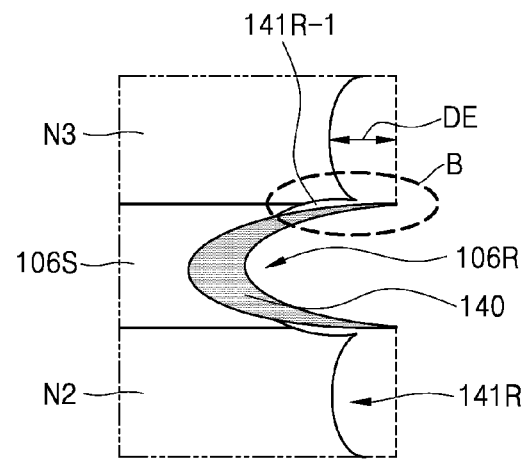
FIGS. 21A and 21B are cross-sectional views for explaining a method of forming an inner spacer and a source/drain protection layer, according to an exemplary embodiment of the present disclosure.
Figure 21A:
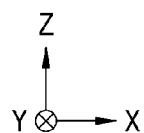
Figure 21B:
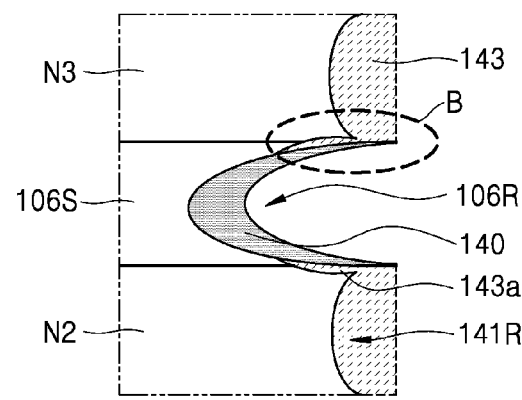
Figure 21B:
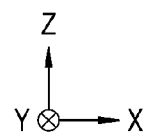

FIGS. 21A and 21B are cross-sectional views for explaining a method of forming an inner spacer and a source/drain protection layer, according to an embodiment of the present disclosure.

In detail, FIGS. 21A and 21B may be the same as FIGS. 20A and 20B, except that a second sheet recess region 141R-1 and a second source/drain protection layer 143a are further formed. Description provided with reference to FIGS. 20A and 20B also applies to the embodiment of FIGS. 21A and 21B and thus will be omitted or briefly provided.

As illustrated in FIG. 21A, a recess region 106R is formed between the plurality of nano-sheets N2 and N3, and an inner spacer 140 is formed in the recess region 106R. Furthermore, a sheet recess region 141R is formed by recessing a sidewall of the plurality of nano-sheets N2 and N3. A depth DE of the sheet recess region 141R may be variously adjusted. When forming the sheet recess region 141R, a second sheet recess region 141R-1 may be formed in an edge portion B between the nano-sheets N2 and N3 and the inner spacer 140.

Next, as illustrated in FIG. 21B, a source/drain protection layer 143 is formed in the sheet recess region 141R on a sidewall of the nano-sheets N2 and N3, by using an epitaxial growth method. When forming the source/drain protection layer 143, a second source/drain protection layer 143a may be formed in a second sheet recess region 141R-1. The source/drain protection layer 143 may reinforce the edge portion B of the recess region 106R, for example, an entry portion, thereby preventing damage to the semiconductor layer 162A or the source/drain region 162 due to penetration of an etchant during isotropic etching of the sacrificial semiconductor layer 106S of FIG. 18.

Figure 22:
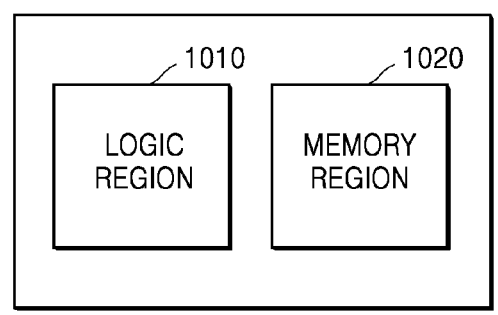
FIG. 22 is a block diagram of an electronic device according to an exemplary embodiment of the present disclosure.

FIG. 22 is a block diagram of an electronic device 1000 according to an embodiment of the present disclosure.

In detail, the electronic device 1000 includes a logic region 1010 and a memory region 1020. The logic region 1010 is a standard cell performing a desired logical function, such as a counter or buffer, and may include various types of logic cells that include a plurality of circuit elements such as a transistor or a register.

A logic cell may include, for example, an AND gate, a NAND gate, an OR gate, a NOR gate, an exclusive OR (XOR) gate, an exclusive NOR (XNOR) gate, an inverter (INV), an adder (ADD), a buffer (BUF), a delay (DLY), a filter (FILL), a multiplexer (MXT/MXIT), an OR/AND/INVERTER (OAI), an AND/OR (AO) gate, an AND/OR/INVERTER (AOI) gate, a D flipflop, a reset flipflop, a master-slaver flip-flop, or a latch. However, the cells are exemplary, and are not limited to the above-described cells.

The memory region 1020 may include at least one of SRAM, DRAM, MRAM, RRAM, and PRAM. The logic region 1010 and the memory region 1020 may include at least one of the semiconductor devices 100 and 300 described above and semiconductor devices having various structures modified and changed within the scope of the present disclosure.

Figure 23:
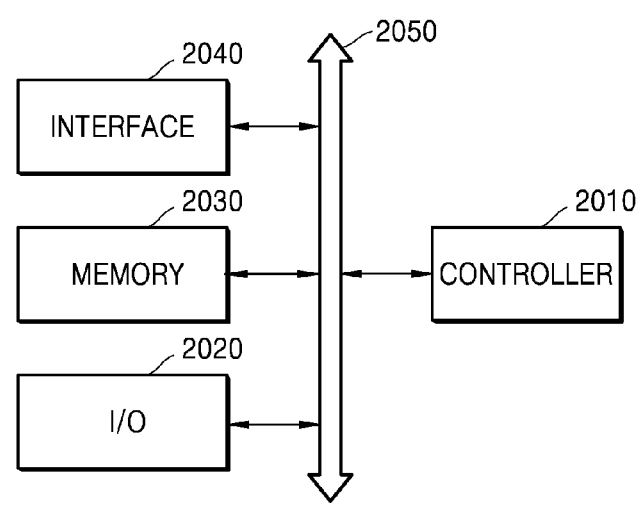
FIG. 23 is a block diagram of a semiconductor device according to an exemplary embodiment of the present disclosure.

FIG. 23 is a block diagram of an electronic system 2000 including a semiconductor device according to an embodiment of the present disclosure.

In detail, the electronic system 2000 includes a controller 2010, an input/output (I/O) device 2020, a memory 2030, and an interface 2040, which are interconnected via a bus 2050. The elements of the electronic system 2000 may include the semiconductor devices 100 and 300 described above.

The controller 2010 may include at least one of a microprocessor, a digital signal processor or similar processors. The I/O device 2020 may include at least one of a keypad, a keyboard, and a display.

The memory 2030 may be used to store a command executed by the controller 2010. For example, the memory 2030 may be used to store user data.

The electronic system 2000 may be configured as a wireless communication device or a device that transmits and/or receives information in a wireless environment. In order to transmit/receive data through a wireless communication network in the electronic system 2000, the interface 2040 may be configured as a wireless interface.

The interface 2040 may include an antenna and/or a wireless transceiver. According to an embodiment, the electronic system 2000 may be used in a communication interface protocol of a third generation communication system such as code division multiple access (CDMA), global system for mobile communications (GSM), north American digital cellular (NADC), extended-time division multiple access (E-TDMA), and/or wide band code division multiple access (WCDMA).

Figure 24:
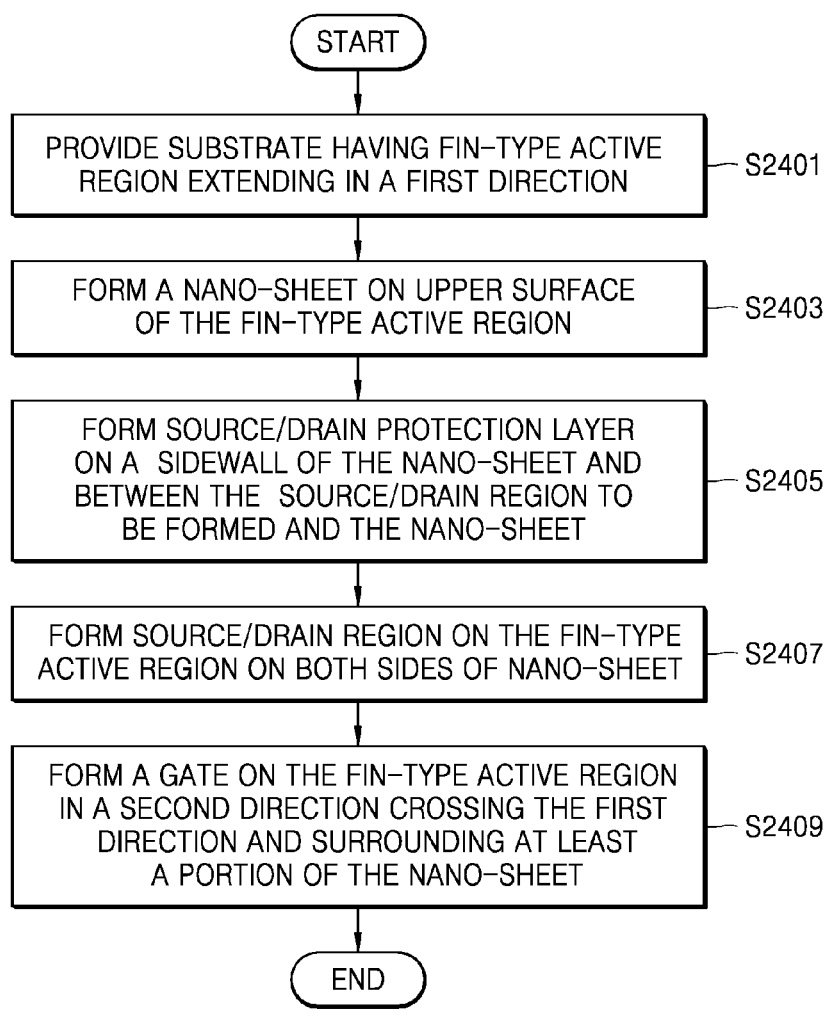
FIG. 24 is flow chart showing a method of manufacturing a semiconductor device according to exemplary embodiments of the present disclosure.

FIG. 24 is a flow chart showing a method of manufacturing semiconductor devices 100 and 300 according to exemplary embodiments of the present disclosure.

In step S2401, a substrate, e.g., a wafer W is provided. The substrate may be a substrate 102 according to the exemplary embodiments as disclosed above. The substrate 102 may include a fin-type active region FA protruding from the substrate 102 and extending in a first direction (X direction) parallel to an upper surface of the substrate 102.

In step S2403, at least one nano-sheet stack structure NSS is formed on an upper surface 104 of the fin-type active region FA. The nano-sheet stack structure NSS may be spaced apart from the upper surface 104 of the fin-type active region FA and facing the upper surface 104 of the fin-type active region FA. The nano-sheet stack structure NSS may include a channel region.

In step S2405, a source/drain protection layer 143 may be formed on a sidewall of the nano-sheet stack structure NSS and between the source/drain region 162 to be formed and the nano-sheet stack structure NSS. The first source/drain protection layer 143 may also be formed on the upper surface 104 of the fin-type active region FA. The source/drain protection layer 143 may be a semiconductor layer used to protect the source/drain region 162 during a manufacturing process of the semiconductor device 100 such as an etching process.

In step S2407, a source/drain region 162 is formed on the fin-type active region FA on both sides of the nano-sheet stack structure NSS. According to exemplary embodiment, the source/drain region 162 may be connected to an end of the nano-sheet stack structure NSS that is adjacent to the source/drain region 162. The source/drain region 162 may include a semiconductor layer 162A that is epitaxially grown from the plurality of nano-sheets N1, N2, and N3 by using a selective epitaxial growth (SEG) process. The source/drain region 162 may include, for example, an epitaxially grown Si layer, an epitaxially grown SiC layer or an embedded SiGe structure that includes a plurality of epitaxially grown SiGe layers. The source/drain region 162 may further include a metal silicide layer 162B formed on the semiconductor layer 162A.

In step S2409, a gate 150 is formed on the fin-type active region FA in a second direction (Y direction) crossing the first direction (X direction) and surrounding at least a portion of the nano-sheet stack structure NSS. The gate 150 may include a main gate portion 150M covering an upper surface of the nano-sheet stack structure NSS and a plurality of sub-gate portions 150S that are connected to the main gate portion 150M.

According to exemplary embodiments, the nano-sheet stack structure NSS may have a rectangular plane shape, but the present disclosure is not limited thereto. The nano-sheet stack structure NSS may have various planar shapes according to a planar shape of the fin-type active region FA and a planar shape of the gate 150.

According to exemplary embodiments, the nano-sheet stack structure NSS may include a plurality of nano-sheets N1, N2, and N3 formed of the same material as the substrate 102.

Semiconductor chips (having integrated circuits formed therein) may be cut from the wafer W and form elements of semiconductor device packages.

While the present disclosure has been particularly shown and described with reference to embodiments thereof and using specific terms, these embodiments are provided so that this disclosure will fully convey the concept of the present disclosure, and not for purposes of limitation. Thus, it will be obvious to one of ordinary skill in the art that various changes and other equivalents may be made therein. Therefore, the scope of the present disclosure is defined not by the detailed description of the present disclosure but by the appended claims.

What is claimed is:

1. A semiconductor device comprising:
a fin-type active region protruding from a substrate and extending in a first direction;
at least one nano-sheet spaced apart from an upper surface of the fin-type active region and facing the upper surface of the fin-type active region, the at least one nano-sheet having a channel region;
a gate extending on the fin-type active region in a second direction crossing the first direction and surrounding at least a portion of the at least one nano-sheet;
a source/drain region on the fin-type active region on both sides of the at least one nano-sheet; and
a source/drain protection layer on a sidewall of the at least one nano-sheet and between the source/drain region and the at least one nano-sheet.

2. The semiconductor device of claim 1, wherein the source/drain protection layer comprises a regrowth layer that is regrown on a sidewall of the at least one nano-sheet.

3. The semiconductor device of claim 1, wherein the source/drain protection layer is disposed in a sheet recess region that is recessed from a sidewall of an outer spacer defining the at least one nano-sheet, in the first direction.

4. The semiconductor device of claim 1, wherein the source/drain protection layer is further disposed between the source/drain region and the gate in the first direction.

5. The semiconductor device of claim 1, wherein an inner spacer is further disposed between the source/drain region and the gate, and between the nano-sheets.

6. The semiconductor device of claim 5, wherein the source/drain protection layer is further disposed between the inner spacer and the gate in the first direction.

7. The semiconductor device of claim 5, wherein the source/drain protection layer is further disposed between the inner spacer and the nano-sheet, at a side of the inner spacer.

8. The semiconductor device of claim 5, wherein the inner spacer is disposed in a recess region that is recessed from a sidewall of the nano-sheets in the first direction.

9. The semiconductor device of claim 8, wherein the source/drain protection layer and the inner spacer are formed as a single unit.

10. The semiconductor device of claim 1, wherein the gate comprises a main gate portion having a first thickness on the at least one nano-sheet in a direction perpendicular to the first direction and a plurality of sub-gate portions having a second thickness in said direction perpendicular to the first direction and disposed between the at least one nano-sheet and the fin-type active region, the second thickness being smaller than the first thickness.

11. The semiconductor device of claim 10, wherein a thickness of the lowermost sub-gate portion from among the plurality of sub-gate portions is greater than those of the other sub-gate portions.

12. The semiconductor device of claim 10, wherein a buffer semiconductor layer is disposed on two sidewalls of the sub-gate portion that is close to the fin-type active region from among the plurality of sub-gate portions.

13. A semiconductor device comprising:
a substrate having an active region;
at least one nano-sheet stack structure spaced apart from an upper surface of the active region and facing the upper surface of the active region, the at least one nano-sheet stack structure including a plurality of nano-sheets each having a channel region;
a gate extending on the active region to cross the active region and covering the at least one nano-sheet stack structure, wherein the gate comprises a main gate portion on the at least one nano-sheet stack structure and a sub-gate portion disposed below each of the plurality of nano-sheets;
a gate insulating layer between the at least one nano-sheet stack structure and the gate;
a source/drain region on the active region on both sides of the at least one nano-sheet stack structure;
an outer spacer on the plurality of nano-sheets and covering a sidewall of the main gate portion;
inner spacers between the source/drain region and the gate, and between the plurality of nano-sheets; and
a source/drain protection layer on a sidewall of the at least one nano-sheet stack structure and between the source/drain region and the at least one nano-sheet stack structure.

14. The semiconductor device of claim 13, wherein the source/drain protection layer is disposed in a sheet recess portion that is recessed inwardly from a sidewall of the outer spacer.

15. The semiconductor device of claim 13, wherein the source/drain protection layer is further disposed between the source/drain region and the gate insulating layer.

16. The semiconductor device of claim 13, wherein the source/drain protection layer is further disposed between the corresponding inner spacer and the gate.

17. The semiconductor device of claim 13, wherein a length of each sub-gate portion disposed below each of the plurality of nano-sheets is greater than a length of the main gate portion in a direction parallel to an upper surface of the substrate.

18. A semiconductor device comprising:
- a fin-type active region protruding from a substrate and extending in a first direction;
- a plurality of nano-sheets that are spaced apart from an upper surface of the fin-type active region and spaced apart from one another in parallel to the upper surface of the fin-type active region, each of the plurality of nano-sheets having a channel region;
- a gate extending on the fin-type active region in a second direction crossing the first direction and surrounding at least a portion of each of the plurality of nano-sheets, wherein the gate comprises a main gate portion on at least one nano-sheet and a plurality of sub-gate portions disposed between the nano-sheets and the fin-type active region;
- a gate insulating layer between the nano-sheets and the gate;
- a source/drain region on the fin-type active region on opposite sides of the at least one nano-sheet;
- inner spacers between the source/drain region and the sub-gate portion and between the nano-sheets; and
- a source/drain protection layer on a sidewall of the at least one nano-sheet, and between the source/drain region and the at least one nano-sheet.

19. The semiconductor device of claim 18, wherein the source/drain protection layer is further disposed between the source/drain region or the inner spacer and the gate.

20. The semiconductor device of claim 18, wherein the inner spacer is formed on each sidewall of the plurality of sub-gate portions, and the inner spacer is convex towards the gate in the first direction.

* * * * *